United States Patent
McKim, Jr.

(10) Patent No.: US 6,531,898 B2
(45) Date of Patent: Mar. 11, 2003

(54) DEVICE USING A DETECTION CIRCUIT TO DETERMINE WHETHER AN OUTPUT CURRENT THEREOF IS SOURCE-INDUCED OR LOAD-INDUCED, AND METHOD THEREFOR

(75) Inventor: James B. McKim, Jr., Blairstown, NJ (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/727,280

(22) Filed: Nov. 30, 2000

(65) Prior Publication Data

US 2002/0063592 A1 May 30, 2002

(51) Int. Cl.[7] .................................................. H03D 1/00
(52) U.S. Cl. ............................. 327/50; 327/29; 327/306
(58) Field of Search ................................ 327/28–30, 50, 327/51, 307, 108, 306, 309, 427, 531, 547, 552; 307/2, 38, 105

(56) References Cited

U.S. PATENT DOCUMENTS

| | | | | |
|---|---|---|---|---|
| 5,498,984 A | * | 3/1996 | Schaffer | 327/51 |
| 5,585,746 A | * | 12/1996 | Franke | 327/54 |
| 5,614,770 A | * | 3/1997 | Suelzle | 307/105 |
| 5,635,868 A | * | 6/1997 | Aiello et al. | 327/538 |
| 5,708,379 A | | 1/1998 | Yoshinski | 327/129 |
| 5,767,545 A | * | 6/1998 | Takahashi | 257/341 |
| 5,903,422 A | * | 5/1999 | Hosokawa | 362/93 |

* cited by examiner

Primary Examiner—Terry D. Cunningham
Assistant Examiner—Long Nguyen

(57) ABSTRACT

A device which uses a detection circuit to determine whether an output current thereof is source-induced or load-induced, and the method therefor. The device which performs some type of operation based upon the determination as to whether the output current thereof is source-induced or load-induced, and method therefor. The detection circuit determines whether polarities of the output current and an output voltage are the same, and determines the output current to be source-induced if the polarities are the same and load-induced if the polarities are opposite each other. Such a device may have many applications, including use in systems where distinctions between source and load-induced currents are employed in feedback systems to control the system voltage source, systems where the system voltage source is not controlled, but other sources are controlled to influence a summation of voltages and currents at sensing locations, and systems for measurement instrumentation.

8 Claims, 19 Drawing Sheets

US 6,531,898 B2

DEVICE USING A DETECTION CIRCUIT TO DETERMINE WHETHER AN OUTPUT CURRENT THEREOF IS SOURCE-INDUCED OR LOAD-INDUCED, AND METHOD THEREFOR

BACKGROUND OF THE INVENTION

1. Field of the Invention

The present invention relates to a device which uses a detection circuit to determine whether an output current thereof is source-induced or load-induced, and the method therefor, and more particularly, to a device which performs some type of operation based upon the determination as to whether the output current thereof is source-induced or load-induced, and method therefor. Such a device may have many applications, including use in systems where distinctions between source and load-induced currents are employed in feedback systems to control the system voltage source, systems where the system voltage source is not controlled, but other sources are controlled to influence a summation of voltages and currents at sensing locations, and systems for measurement instrumentation.

2. Description of the Related Art

An electronically programmable output impedance circuit is described in U.S. Pat. No. 5,708,379, issued Jan. 13, 1998 to Yosinski. The electronically programmable output impedance circuit therein is employed in a very specific manner in an AC source/analyzer product family, but has broader application.

The AC source/analyzer product family includes models which are DC-coupled and which also employ a novel feedback circuit, an output impedance circuit, which is described in U.S. Pat. No. 5,708,379 issued to Yosinski, which causes the source part of the product to exhibit a controlled non-zero output impedance. The output impedance may be set to be resistive or inductive. It may also be set to a complex value that is equivalent to series-connective resistive and inductive components. The magnitudes of the resistive and inductive components are programmable. For realizations in the AC source/analyzer products, the resistive component may be set to values between zero and one ohm, and the inductive component to values between 20 uH and 1 mH. Different ranges are possible subject to constraints imposed by necessity of maintaining stability in feedback loops.

DC-coupled members of the AC source/analyzer product family also employ another feedback circuit, a DC offset elimination circuit used as a DC servo control loop that may be enabled to eliminate unwanted DC offset voltages at the product's output.

As will be shown below, the output impedance circuit and the DC offset elimination circuit, when active simultaneously, interact in an undesired manner that compromises the functionality and performance of the output impedance circuit at low frequencies including DC.

Practical applications for DC-coupled laboratory grade AC sources require simultaneous operation of both the output impedance circuit and the DC offset elimination circuit mentioned above. When AC sources are used to simulate AC power systems, it is desirable to have both resistive and inductive source impedances, since real systems exhibit a finite source impedance which includes both components. The magnitudes of the impedance components vary widely in real systems, making programmability highly desirable.

Aside from the effects of source impedance, actual AC power systems appear as nearly ideal sources for loads of the size that may powered by all but the very largest laboratory grade AC sources. To the extent that the source acts ideally, it will be capable of supplying any amount of current at any frequency. For this reason, it is essential for the output impedance circuit to work properly at very low frequencies including DC. Loads with varying current consumption, for example, may exhibit "beat-frequency" effects that produce AC power system currents at low frequencies and/or DC. Adjustable speed drives (ASDs) are a commonly encountered example of such loads. Another common example is a half-wave rectified load which draws DC current from an AC power system.

Aside from the desired property of correctly simulating effects of source impedance and DC load current, it is otherwise essential to have as little DC voltage present at the output of laboratory grade sources as possible since equipment with line-connected power transformers may exhibit very little tolerance for DC voltage. DC levels of just a few millivolts can cause power transformers in the supplied equipment to saturate.

On the other hand, it is undesirable for the source to actually be AC-coupled using, for example, an output transformer since practically-sized output transformers exhibit properties that preclude proper simulation of many events with DC content that occur in AC power systems. Examples include partial cycle dropouts, non-symmetrical voltage waveforms, etc.

To assist in an understanding of the present invention, it is helpful to understand the operation of the output impedance and DC offset elimination circuits. In the discussion that follows, operation of the circuits is considered independently and then in combination. Highly simplified circuits imported from a circuit simulator and scaled to nominal values will be used to develop an understanding of the essential concept of the present invention.

FIG. 1A shows a very basic voltage source 100 which includes an inverting power amplifier 102. A DC voltage source 104 is shown to represent an accumulated effect of undesired offset voltage sources encountered in practical devices. For the sake of simplicity, the overall gain to the output of the basic voltage source 100 is set to −1. A current sensing element, or shunt, identified as 106, is coupled to 1000X differential gain block 108 (hereinafter referred to as "differential gain block") to provide a voltage output proportional to output current. Actual implementations may use differential amplifiers, but otherwise, the function and value for the current sensing element 106 and associated differential gain block 108 are as might be encountered in practice.

Feedback is provided through an operational amplifier 110 which is configured as a unity gain follower. The voltage at the output side of the current sensing element 106 is connected to the positive terminal of the operational amplifier 110. The feedback sensing point is selected to cause voltage drops across the current sensing element 106 to be inside of the feedback loop, so that the voltage at the right hand, or output, side of current sensing element 106 is regulated by the action of the feedback. A resistor 114 is connected between the output terminal of the operational amplifier 110 and the negative terminal of the inverting amplifier 102. A resistor 116 is connected between the DC voltage source 104 and the negative terminal of the differential amplifier 102. A circuit comprising power amplifier 102, operational amplifier 110, and associated input and feedback resistors 114, 116, and current sensing element 106 are thus configured to function as an ideal voltage source. As an example, current sensing element 106, and resistors 114 and 116 have the values 0.001 ohm, 10k ohm and 10 k ohm, respectively.

Typically, another differential amplifier would be used in a voltage feedback signal path, but for purposes of this example, it is useful to include the operational amplifier (configured as a unity gain follower) 110 as shown since it is functionally transparent except for its action to prevent current flowing in the feedback resistor 114 from becoming part of the total current sensed by the current sensing element 106. Thus, only the load current is shown in meter 122. One volt displayed in meter 122 corresponds to one ampere of load current. All of the meters 120, 122, 124 shown in FIG. 1A are DC sensing.

A one-ampere current sink 118 is connected to the output node of the voltage source 100 in FIG. 1A. The resulting current flow develops a voltage across current sensing element 106 which is amplified by the associated differential gain block 108 and displayed as 1 volt in meter 122. As would be expected with an ideal voltage source, the load current produces a negligible voltage drop at the voltage source output as shown by meter 120.

FIG. 1B shows essentially the same circuit as shown in FIG. 1A, but with DC input voltage source 104 set to −1 volt to represent significant accumulated DC offset error voltage. In this case, an output voltage of +1 volt is now observed at meter 120, consistent with the operation of the overall circuit as a unity gain inverter. Since the current sink 118 representing the load remains set to one ampere, the change in output voltage produces no additional current flow.

FIG. 1C shows the same circuit as shown in FIG. 1B, but with the current sink 118 replaced by a resistor 132. In this example, the resistor 132 has a value of one ohm. Consequently, one ampere of load current flows, as a result of the +1V output produced by DC input voltage source 104 representing accumulated DC offset error voltages.

FIG. 1D shows the same circuit as shown in FIG. 1A with an additional resistor 134 placed between the current sink 118 and a feedback sensing point 136 at the right-hand side of the current sensing element 106. In this example, the resistor 134 has a value of one ohm. As in FIG. 1A, the DC input voltage source is set to 0.0V. Note that the output voltage shown by meter 120 is now −1 volt, reflecting the voltage drop across the resistor 134 induced by the load current. Note also that FIGS. 1A through 1D all show a voltage at the output terminal of inverting amplifier 102 which is 1 mV greater than the output voltage or, in the case of FIG 1D, than the voltage at sensing point 136. The difference reflects the voltage drop developed in response to the flow of one ampere through the resistance of 0.001 ohms for current sensing element (shunt) 106 as given for purposes of example.

FIGS. 1A through 1D depict basic configurations of a source part of an AC source/analyzer product, and show how internal DC offset voltage errors are transferred to the output where they may produce undesired effects in a connected load. In addition, these figures help illustrate an important distinction between output currents that are "source-induced" as compared to output currents that are "load-induced." The current in FIG. 1C is source-induced in the sense that an output voltage is required to produce current flow in a connected load. The load in this case is represented by the resistor 132, but may be more generally represented by any complex impedance. In contrast, the current in FIGS. 1A, 1B and 1D is load-induced in the sense that the current flow is independent of the output voltage. More generally, this current may flow at any frequency including DC and, to the degree that the source/sink representing the load is ideal, the current flow is independent of and unaffected by changes in the source output voltage.

If the convention is adopted that current flow from the source into the load is considered "positive," it may be observed from FIG. 1C that the output voltage producing the source-induced current has the same polarity as the current. On the other hand, if the source has a finite output impedance as represented by the resistor 134 placed outside the feedback loop in FIG. 1D, load-induced currents will cause an output voltage that is opposite in polarity from the current flow.

In FIG. 1B the current polarity and output voltage polarity are the same, but the output voltage is produced in response to DC input voltage source 104, not in response to load current. This may be seen by referring to FIG. 1A where DC voltage source 104 is set to 0.0 V while current sink 108 remains set to 1 ampere, but in this case no output voltage results.

The significance of the distinction in polarities observed for source-induced and load-induced currents in the presence of output impedance will be described in detail with regard to the present invention.

FIG. 2 shows the basic voltage source 100 shown in FIG. 1B with a simplified representation of a DC offset elimination circuit 200 added thereto. The DC voltage source 104 has a value of −1 volt in this example. The DC offset elimination circuit 200 includes an operational amplifier 202 which is configured as a differential integrator having for practical purposes infinite gain at DC and unity gain at a frequency defined by a time constant for the RC elements comprising resistor 204, resistor 212 and capacitors 206 and 208. The values of the two resistors are normally set to be equal; the same being true also for the capacitors 206 and 208. The resistors 204 and 206 in this example have values of 100 k ohm and the capacitors 206 and 208 have values of 1 $\mu$F. For these values, unity gain occurs at 1.59 Hz.

Operational amplifier 202 and associated elements 204, 212, 206, and 208 together compromise the differential integrator. A resistor 212 is connected to the positive input of voltage follower 110 and to the right-hand side of current sensing element 106 (the output of the voltage source 100). With this connection for resistor 212, the differential integrator comprised of amplifier 202 and associated elements is configured to sample the output voltage (and DC content thereof) of voltage source 100.

A resistor 210 has an end connected to the output of the amplifier 202 (as well as an end of the capacitor 206). The resistor 210 has a value of 10 k ohm in this example. The other end of resistor 210 is connected to the junction of resistors 116, 114 and the negative input terminal of the inverting power amplifier 102. This connection to the "summing junction" of amplifier 102 provides means for the differential integrator to introduce corrective feedback to eliminate undesired DC voltages from the output of voltage source 100. As noted above, the conditions in FIG. 2 are as for FIG. 1B, that is, with DC input voltage source 104 simulating accumulated DC offset error voltages set to −1V. This condition should produce +1 volt at the output of voltage source 100, however, the action of the DC offset elimination circuit 200 serves to introduce corrective feedback via resistor 210 which removes DC voltage from the source's output that otherwise would be observed given the DC input source.

From a frequency response standpoint, the action of the DC offset elimination circuit 200 behaves as a first order high-pass function resulting in a diminishing effect at higher frequencies. The −3 db corner frequency is effected by both the ratio of the feedback resistor 210 to input resistor 116 and by the unity gain frequency of the differential integrator. When the resistor ratio is unity (as evidenced by both the resistor 210 and the resistor 116 having values of 10 k ohm in this instance), the integrator unity gain frequency equals the −3 db frequency for the overall system. At AC power system frequencies, the effect of the DC offset elimination circuit 200 is sufficiently small that the AC gain error for voltage source 100 is less than 0.02% for AC signals introduced at the location of voltage source 104 (the nominal input for voltage source 100).

For a product designer, the circuit shown in FIG. 2 imposes a design tradeoff that must be appropriately resolved for an intended application. If the corner frequency for DC offset elimination circuit 200 is set too high, unnecessarily large AC gain errors result at power system frequencies, thus compromising the source's function as an ideal AC power source. On the other hand, if the corner frequency is set too low, the DC offset elimination circuit 200 will fail to adequately remove undesired error voltages at near-DC frequencies. Generally, the corner frequency will be set as high as possible without unacceptably impacting gain accuracy at AC power system frequencies (e.g., at 50, 60 and 400 Hz).

This distinction in frequency between desired and undesired source-induced signals is critically relevant for the present invention as will be explained later.

FIG. 3 shows the basic voltage source 100 of FIG. 1B with an output impedance circuit 250. The output impedance circuit 250 includes a resistor 252 connected between the negative input terminal of power amplifier 102 and the output of the differential gain block 108. In this example, resistor 252 has a value of 10 k ohm. In this case, only a fixed resistive feedback loop is shown. Circuit values are scaled to cause output impedance, in this case resistance, of one ohm. In very simple terms, the circuit acts to generate a feedback signal to summing junction 254 (formed at the negative input terminal of power amplifier 102 by the junction of resistors 116, 114 and 252) that is proportional to output current. For the values indicated, one ampere of output current produces a one volt change in the output voltage thus corresponding to one ohm of resistive output impedance. The output voltage shown by meter 120 is entirely due to the flow of current through the output impedance since the DC error input voltage source is set to 0.0 V. As shown previously in FIG. 1D, the output voltage is opposite in polarity from the output current according to the previously established convention that current flow from the source to the load represents positive current flow. Opposition in polarity occurs because, as also noted previously, the current flow is load induced in this example.

The operational amplifier 110 has infinite input impedance because it is an ideal component such that no current flows in that path.

The differential gain block 108 senses the voltage developed across current sensing element 106 in response to current, and develops an output voltage which is proportional to current, in this case, one volt is equal to one ampere. The voltage at the output of differential gain block 108, when directed as feedback through resistor 252 has the effect of creating an output impedance. This result occurs because the sign of the feedback is selected such that the overall feedback to summing junction 254 of inverting power amplifier 102 (including that provided via voltage follower 110 and resistor 114) reaches equilibrium when the output voltage has in fact dropped slightly in response to output current. The combined action of the two feedback paths (one via resistor 114 and the other via resistor 252) effectively creates the same behavior at the output of voltage source 100 as would be observed with actual source impedance.

FIG. 4A shows the basic voltage source 100 with both the DC offset elimination circuit 200 shown in FIG. 2 and the output impedance circuit 250 shown in FIG. 3 added thereto with a −1V DC input voltage as previously shown in FIG. 1B.

In FIG. 4A, the DC error input voltage 104 is set to −1V. The DC offset elimination circuit 200 correctly removes the effect of the DC error voltage from the source's output, but in addition acts to incorrectly remove the output voltage that should result from one ampere of load-induced current flowing through the one ohm output impedance synthesized by the action of feedback of a signal proportional to output current via resistor 252. The true nature of this undesired effect is more obvious when viewed in the frequency domain as shown in FIG. 4B. Substitution of a voltage controlled swept-frequency one ampere AC current sink 260 for the fixed one ampere DC current sink 118 (see FIG. 4A) as given in FIG. 4C permits the frequency response of the output impedance to be observed. Note that the meters shown in FIG. 4C are now AC responding.

FIG. 4B shows the voltage appearing at the output of voltage source 100 in response to the swept one ampere load-induced current produced by the voltage controlled AC current sink comprised of current sink 260 and the controlling voltage source 262. From FIG. 4B, it may be seen that the load-induced current approximately produces the expected one volt at the source's output for frequencies above 10 Hz, but if frequencies fall below 10 Hz, the expected output voltage is increasingly removed by the action of the DC offset elimination circuit 200. The effect is equivalent to reducing the output impedance as the frequency approaches DC. This result is contrary to the desired effect since a resistive output impedance should remain constant with respect to frequency. The −3 db point in the response is at 1.59 Hz due to the combined effect of the integrator time constant and the feedback ratio as described previously. The phase angle at frequencies well below the −3 db point reflects the fact that the impedance at those frequencies appears inductive rather than resistive as desired. This outcome would be expected from a magnitude response that increases by 20 db per decade with increasing frequency, but frequency dependency remains undesired.

One of the uses for the AC source product shown in FIG. 4A is to conduct tests of a wide range of electronic equipment for compliance with international standards for certain types of low frequency emissions that come from products, and in particular, one of these compliance tests is for a type of emission called flicker. Flicker is the varying light intensity observed when incandescent lamps are subjected to varying AC voltages induced by time-varying currents in AC power systems having source impedance.

Many people think of an AC power, or mains, system as an infinite source, in other words, as a voltage source with no source impedance. In fact, any mains system has a fairly significant amount of impedance. Accordingly, when conducting flicker tests it is necessary for the source to exhibit an output impedance similar to that encountered in actual mains systems. For any type of equipment connected to the AC power source, practical embodiments of AC source products such as shown in FIG. 4A attempt to simulate the source impedance of the main system when conducting flicker tests.

There is generally a standard or reference value which is specified in the emissions standard. For European 50 Hz ompliance test standards this value is 0.4+j0.25 ohm, that is, 0.4 ohms resistive and 796uH of inductance. Different, but similar, values will typically be specified for AC mains systems in other regions of the world. Further, it may be desired to set the source impedance to a reference output impedance value for tests other than flicker compliance tests. This may be desired since similar values will be encountered in real mains systems and thus having these values present allows the AC source to better simulate the environment within which the equipment under test (EUT) actually will operate in practice.

Thus, AC source/analyzer products which are practical embodiments of the circuit shown in FIG. 4A seek to simulate source impedance with a feedback loop: However, as noted above, there is another loop which is directed towards removing a DC voltage from the output because an ideal main system has no DC content. Of course, a truly ideal mains system has no output impedance either, but as described above source impedance either is required for conducting certain compliance tests or may be desired for purposes of more accurately simulating actual mains system environments. The problem that occurs with embodiments such as given in FIG. 4A is that the DC offset elimination loop interferes with the output impedance loop as you approach DC, and in fact, it totally corrupts the same when you get to DC. Accordingly, there is no source impedance at DC, but such a situation is not desirable since it does not properly simulate the actual situation in mains systems. A pure inductance approaches zero impedance as the frequency approaches DC, but resistance is constant with frequency. As shown in FIG. 4B, the interaction between the impedance loop and the DC offset removal loop is such that the entire output impedance including the resistive component improperly approaches zero impedance as the frequency approaches DC. For the circuit values given as an example in FIGS. 4B and 4C, significant errors begin to be introduced about 10 Hz.

One presumption is that if all else fails, output impedance may be implemented by actually putting a discrete inductor and resistor in series with the output of a product; in other words, by using physical components. If one does that, there is no problem with whether the source works properly at DC. There are other problems, however. First, the resistive component dissipates a significant amount of power leading to inefficient operation and possible design tradeoffs. Secondly, since it is desired to have a range of values available for both the resistive and inductive components, advantages of cost-effective programmability attendant to a loop implemented approach as given in FIG. 4A are lost. It is possible to construct a programmable discrete component based series impedance, however, such implementations will be large, costly, and most likely unable to effectively simulate low impedance. This last problem occurs because parasitic resistance of switching elements such as relays will be significant and variable with time therefore difficult to characterize and control yet these same switching components are necessary to implement programmability.

As noted above, it is desired that the resistive component of the output impedance remain constant with frequency including DC. Further, it is desired also that the inductive component should be an impedance which is controlled solely by the selected inductance value and frequency and which is not influenced in addition by interaction with the DC offset removal loop. The reason why this behavior matters is that if there is an equipment connected as a test load which has a varying current, the current is effectively amplitude modulated. Amplitude modulation produces energy at side band frequencies about the carrier which in this case is the line frequency. These side bands can go down to DC for certain types of equipment, so for purposes of characterizing load-induced voltage drops across the AC system impedance it is quite relevant as to whether or not you have the proper impedance at DC.

One possible way to solve such a deficiency is by turning off the loop that removes the DC, but then DC voltages would be present which is also undesired.

The above-described power source circuit is an AC source which is DC capable. It is a switch mode inverter which provides an AC output at relatively high power and simulates the AC power, or mains, system as a source, but is DC coupled.

The AC mains system is inherently AC coupled. There are transformers all throughout the system and at multiple levels between low power loads that are plugged into a conventional wall outlet and the system generator or source. Despite the fact that the system is not an ideal source for most low power equipment, the system looks like it is a very large source compared to the power that the load is drawing. Because the system is large compared to low power loads, it can support DC current drain from products without an apparent generation of DC voltage. Connected loads drawing DC current induce DC voltages in the source because of the source impedance, but this situation is quite different from subjecting the load to a source-induced DC voltage. The reason for this primarily has to do with transformers and the products themselves. If the product itself includes a power transformer and it's a relatively high powered product, on the order of a kilowatt or so, a few millivolts or a few tens of millivolts of DC can cause the product's power transformer to saturate. Saturation produces abnormal operation in the load and for this reason it is very undesirable to have uncontrolled DC present in the source. Smaller products may be less susceptible to saturation in the presence of a particular level of DC source voltage, but the risk of transformer saturation remains.

One of the problems with the situation described is that there is no way to know what the load is. It may be large or small and it may or may not include a power transformer. The AC power source product is intended to be general purpose and therefore capable of acting as a power source for virtually any type of load. Thus, there is a situation where some loads will be susceptible to the problems with DC content, and some won't, but there is no way of knowing, which basically creates a situation where it is necessary to minimize source induced DC content. The problem is that the most effective way to do this because of practical constraints is to put a DC offset voltage elimination loop in the system. Consideration was made of improving the quality of the components and the products themselves so as to eliminate the need for the DC offset elimination circuit loop or not use it when tests are being conducted where the output impedance presence is desired. However, such a modification would add a significant amount of cost and not improve the results to a satisfactory level. Certainly, the benefit would not be to the degree that would be achieved by keeping the DC offset removal loop operational.

If both the DC offset elimination circuit and the output impedance circuit are operating at the same time, the DC offset elimination circuit is incapable of distinguishing between low frequency AC and/or DC voltages appearing at the source output that are caused by the source as opposed to ones that are caused by the load. It is acceptable to have voltages developed at the output that are caused by load behavior, but one does not want DC voltages at the output caused by source behavior.

SUMMARY OF THE INVENTION

Accordingly, it is an object of the present invention to overcome the disadvantages of the conventional art.

It is another object of the present invention to provide a device which detects whether an output current is source or load-induced and to perform an operation based upon the detection.

It is another object of the present invention to provide a device which determines an output current and an output voltage, and based upon the polarities of the output current and the output voltage, determines whether the output current is source or load-induced.

It is another object of the present invention to provide a voltage source which detects and removes source-induced low frequency and DC output voltages and load currents thereby induced and maintains load-induced low frequency and DC output voltages developed as a result of load-induced currents flowing through an output impedance.

Additional objects and advantages of the invention will be set forth in part in the description which follows and, in part, will be obvious from the description, or may be learned by practice of the invention.

The above and other objects and advantages are achieved by providing a source having an impedance and connected to a load, the source comprising: a detection circuit to determine whether a current flow through the impedance is load-induced or source-induced; and a processing circuit to perform an operation based upon whether the current flow is load-induced or source-induced.

The above and other objects and advantages are further achieved by providing a power source circuit comprising: a voltage source to generate an output voltage; a DC offset elimination circuit, which is a DC servo control loop connected to the voltage source, to eliminate undesired DC offset voltages added to the output voltage; and an output impedance circuit, which is a feedback loop connected to the voltage source, to generate an output impedance for the source and which operates simultaneously with the DC offset elimination circuits; and a detection circuit, connected between the DC offset elimination circuit and the output impedance circuit, which determines whether a current flow through the output impedance is load-induced or source-induced, and which selectively eliminates undesired voltages and resultant current flow which are source-induced.

The above and other objects and advantages are still further achieved by providing a method of controlling operations of a source which is connected to a load, the method comprising: determining whether a current flow through an impedance of the source is load-induced or source-induced; and controlling one of the operations based upon the whether the current flow is load-induced or source-induced.

The above and other objects and advantages are still yet further achieved by providing a method comprising: generating an output voltage controlled by a feedback loop; forming a first additional feedback loop which eliminates DC offset voltages of the output voltage; forming a second additional feedback loop to generate an output impedance for the power source circuit simultaneously with the eliminating of the DC offset voltages; and determining whether a current flow through the output impedance is load-induced or source-induced, and selectively eliminating the current flow which is source-induced.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1A:
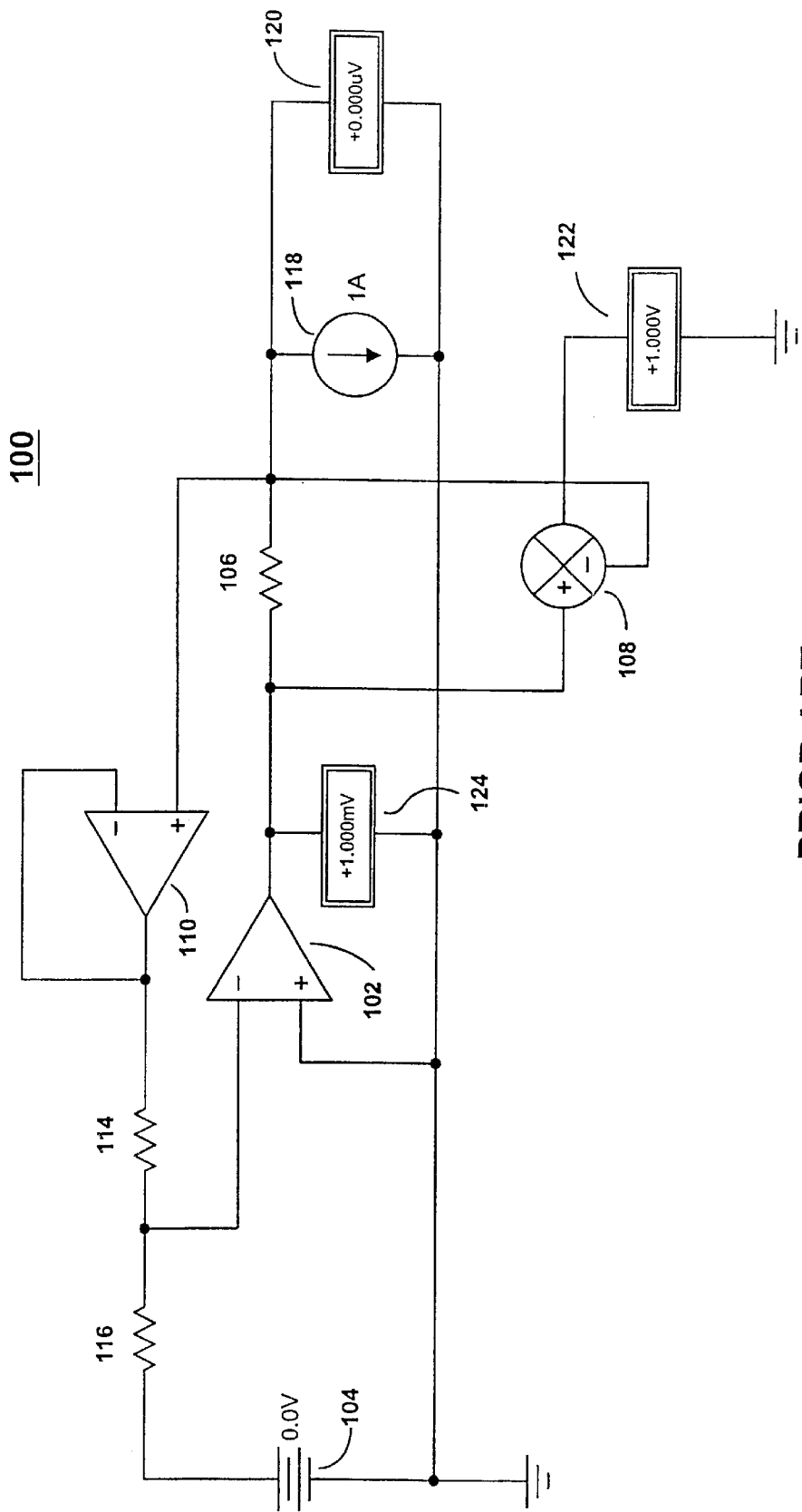
FIG. 1A is a schematic diagram of a conventional voltage source.
Figure 1B:
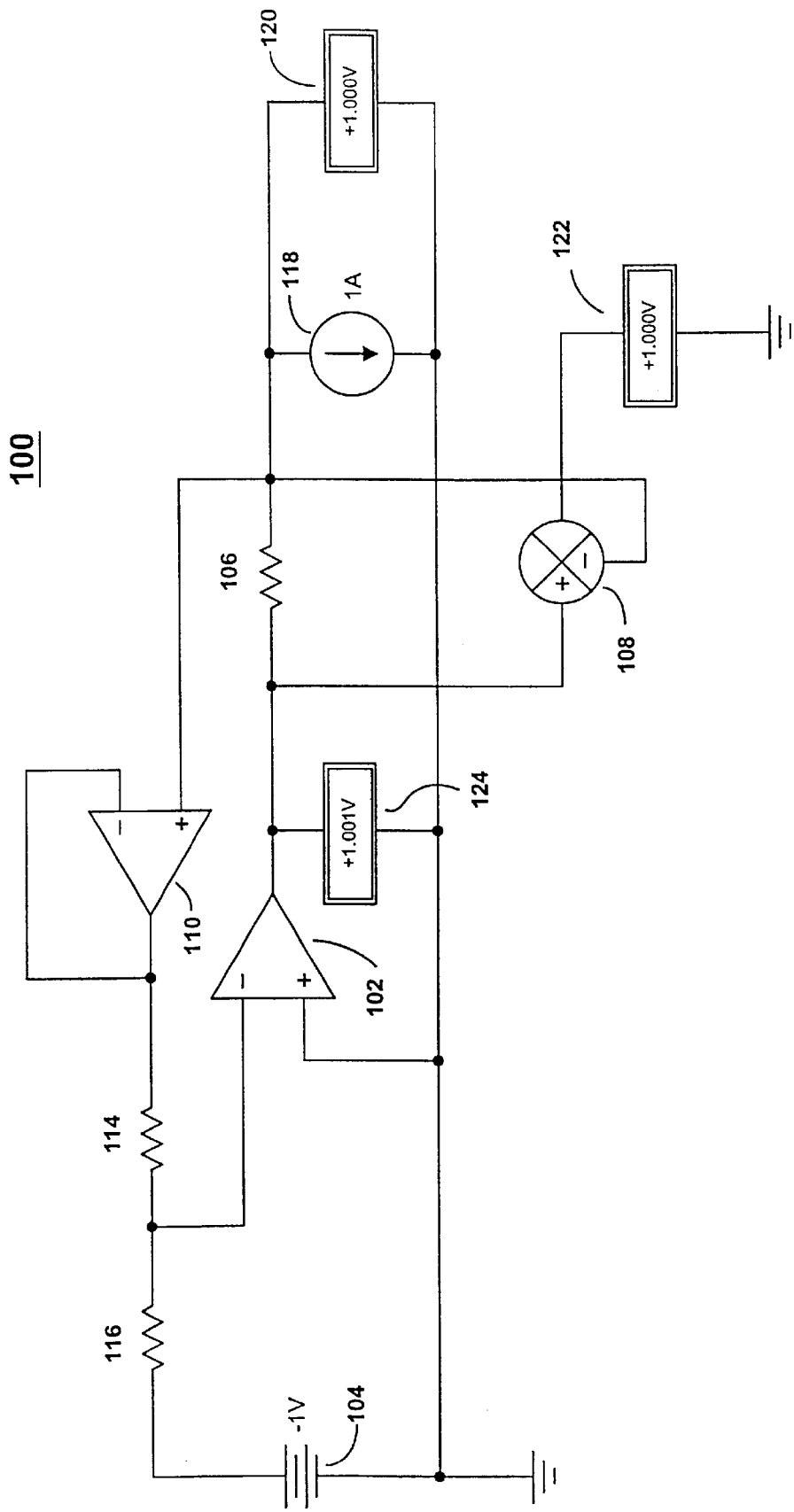
FIG. 1B is a schematic diagram of the conventional voltage source shown in FIG. 1A, except with a different DC input voltage source simulating the accumulated effect of undesired DC offset error voltages.
Figure 1C:
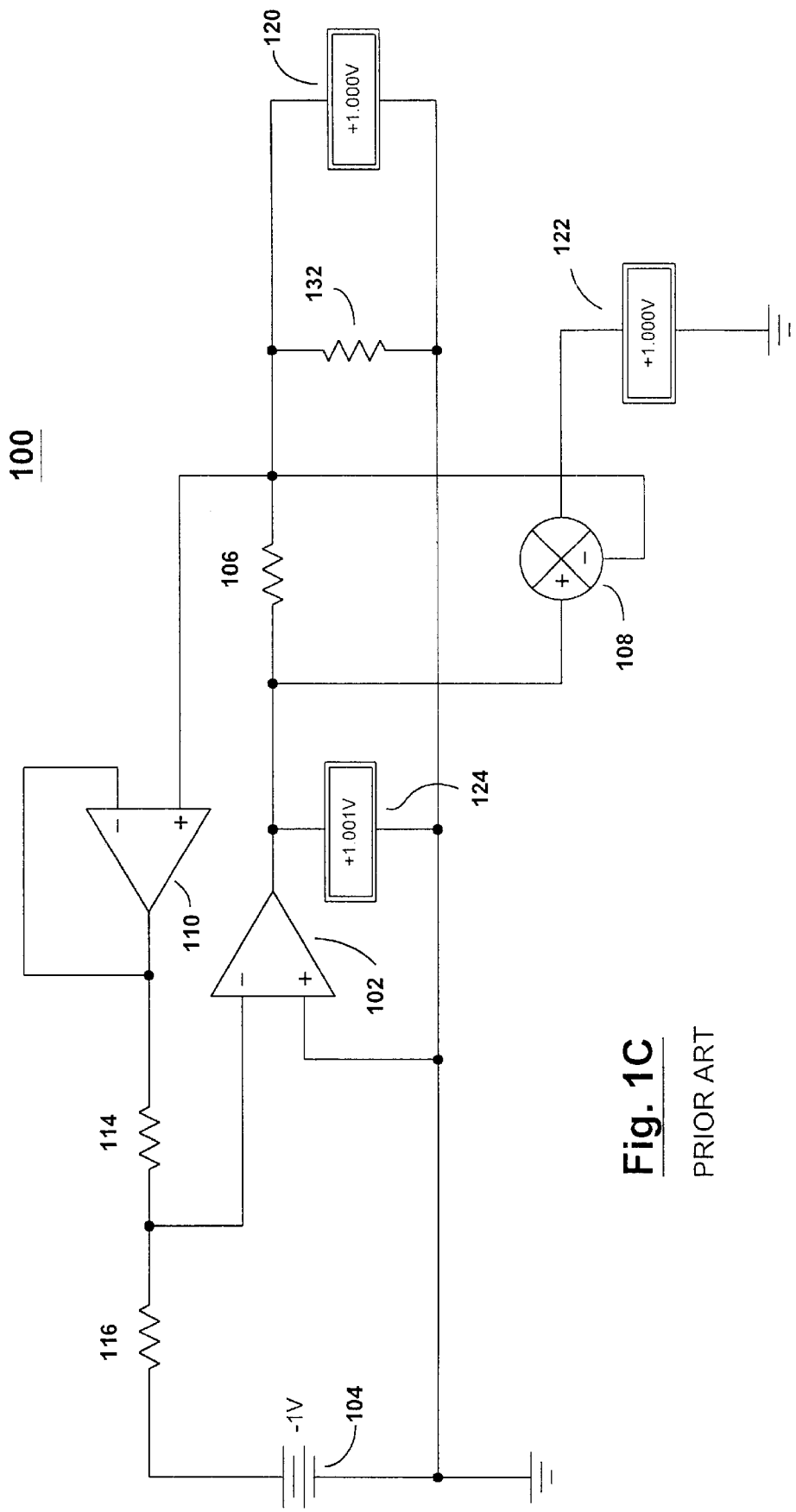
FIG. 1C is a schematic diagram of a second conventional voltage source.
Figure 1D:
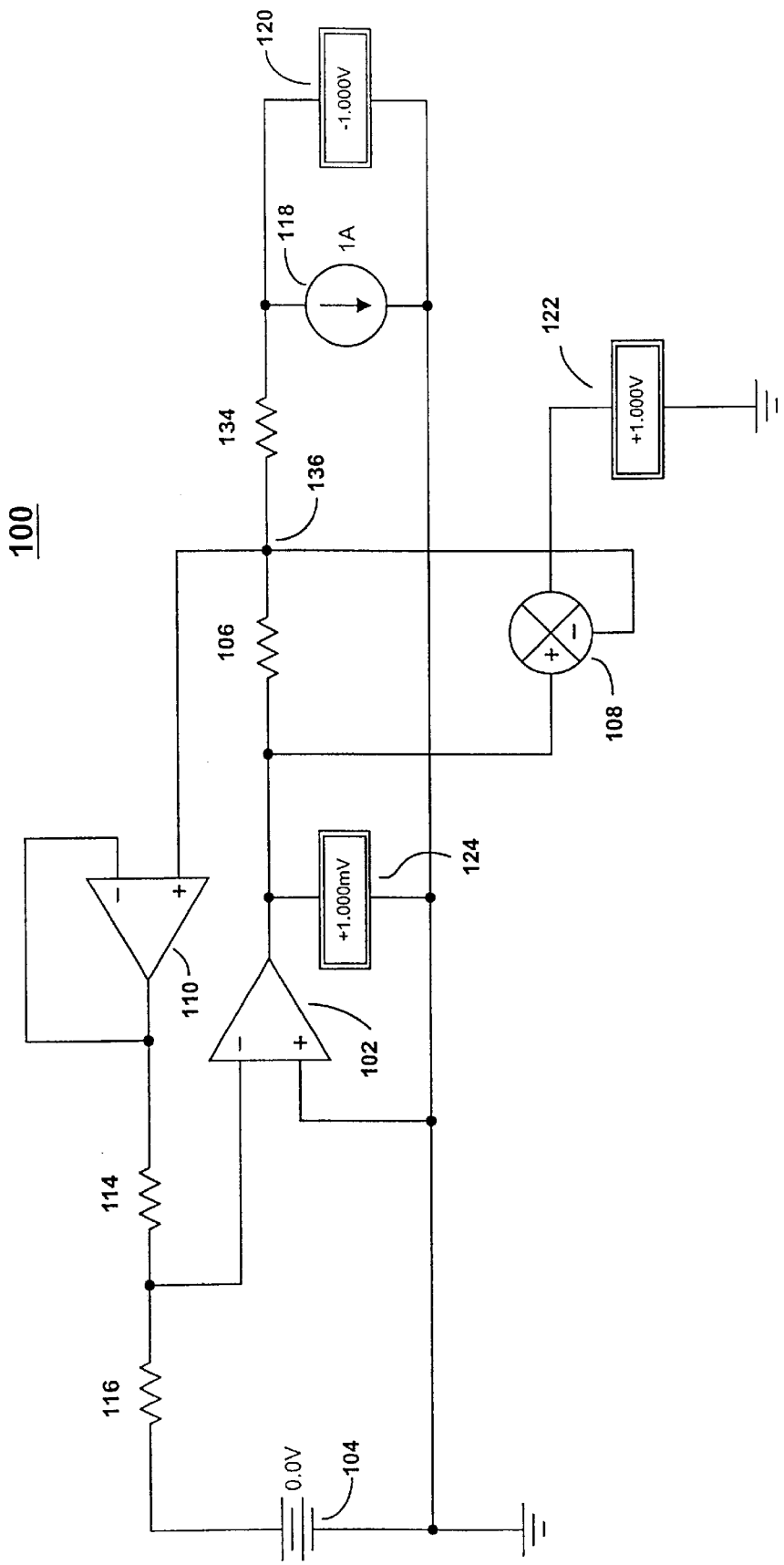
FIG. 1D is a schematic diagram of a third conventional voltage source.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

Figure 5:
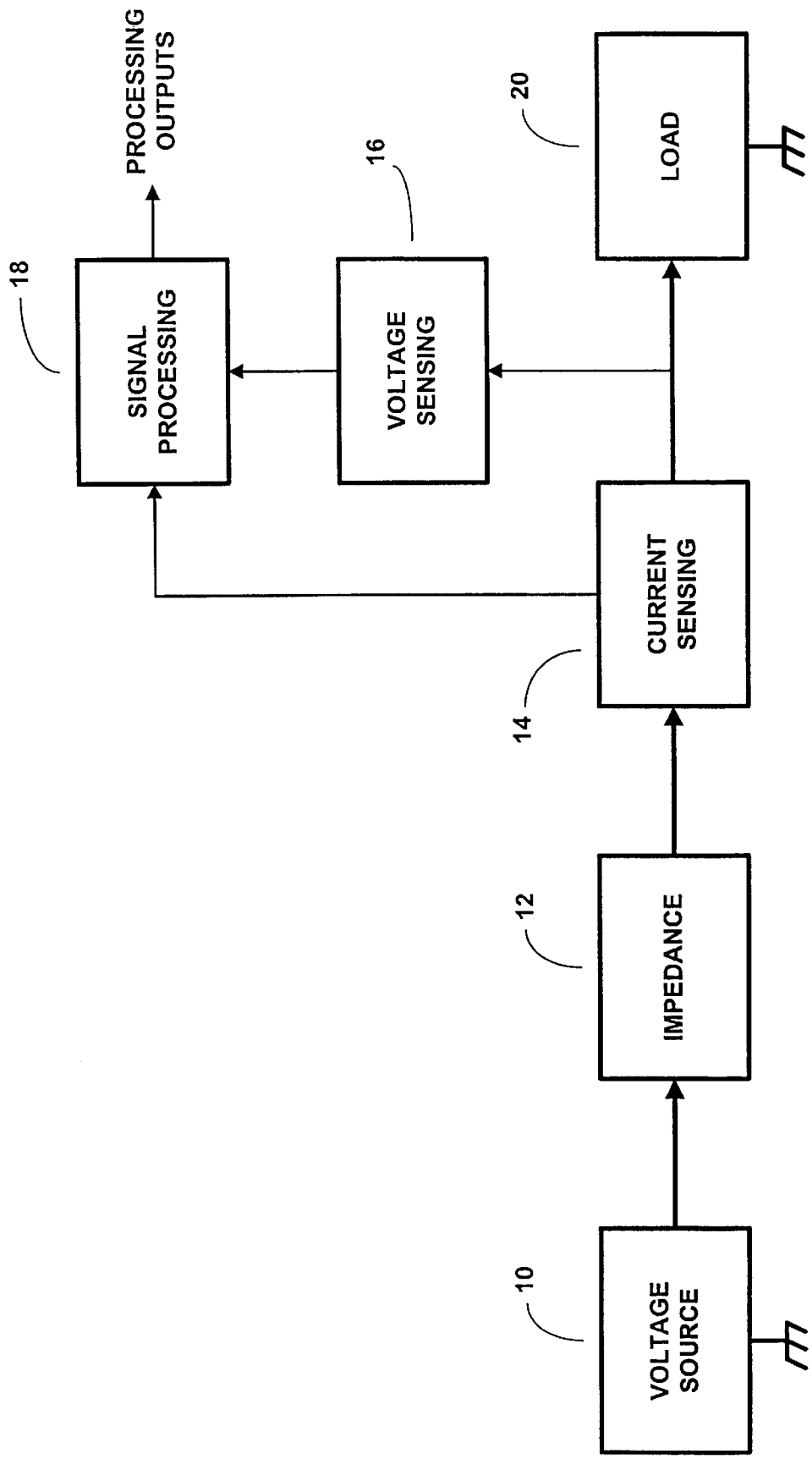
FIG. 5 is a generalized block diagram of a circuit for utilizing voltage and current polarities to distinguish between source and load induced current flows through an impedance placed in series between a voltage source and a connected load.

FIG. 5 is a generalized block diagram of a circuit for utilizing voltage and current polarities to distinguish between source and load induced current flows through an impedance placed in series between a voltage source and a connected load. FIGS. 8A through 11B show a very specific use of this technique in a feedback system to eliminate undesired interactions between other signals included in the same feedback system. The feedback system described in FIGS. 8A through 11B comprise a voltage programming source, various control loops and a power amplifier these components together comprising a laboratory grade DC-coupled AC power source.

In FIG. 5, a voltage source 10 is shown with a connected load 20. An impedance 12 and a current sensing element 14 are placed in series between the voltage source 10 and the load 20. The current sensing element 14 provides information about the magnitude and polarity of current flows between the source and the load. A voltage sensing element 16 is connected to the source side of the load 20 to sense voltages developed at the load 20 in response to current flow. The voltage sensing element 16 also provides magnitude and polarity information. The series impedance 12 causes voltages at the load 20 to differ from the voltage source value for any non-zero current flow. Output signals from the current and voltage sensing elements 14, 16 are connected as inputs to a signal processing block 18, so that the signal processing block may be configured for a wide variety of purposes.

If a convention is adopted that so-called "conventional" current flow (i.e., not electron flow) from the voltage source 10 to the load 20 is considered "positive," then source induced positive current flow will produce positive voltages at the voltage sense point, while load induced positive current flow will produce negative voltages.

Figure 6:
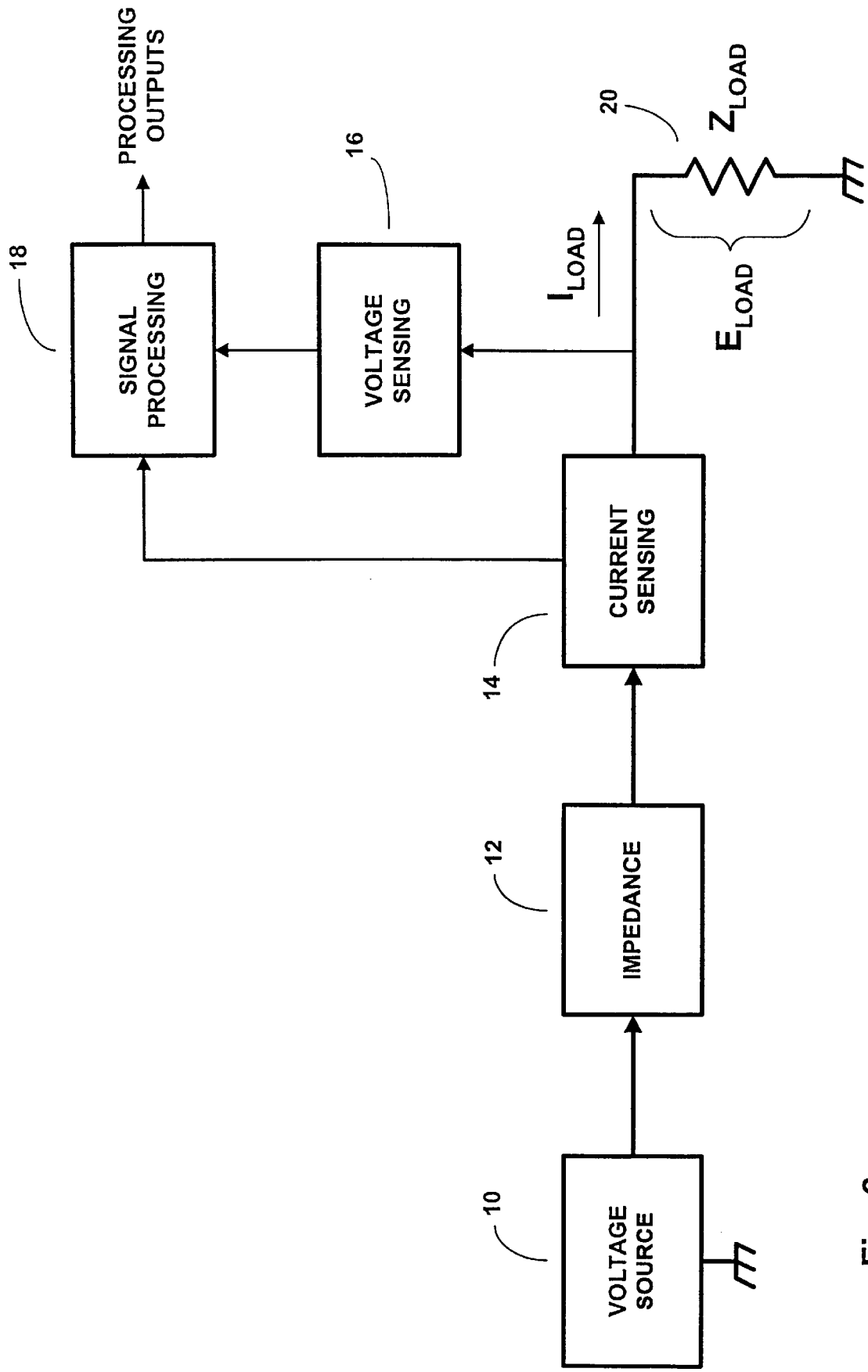
FIG. 6 shows a first case for the circuit shown in FIG. 5, where the current flow is source induced.

FIG. 6 shows a first case, where because current flow is source induced, it follows that the load 20 is an impedance $Z_{load}$. By Ohm's law, $E_{load} = I_{load} * Z_{load}$.

Figure 7:
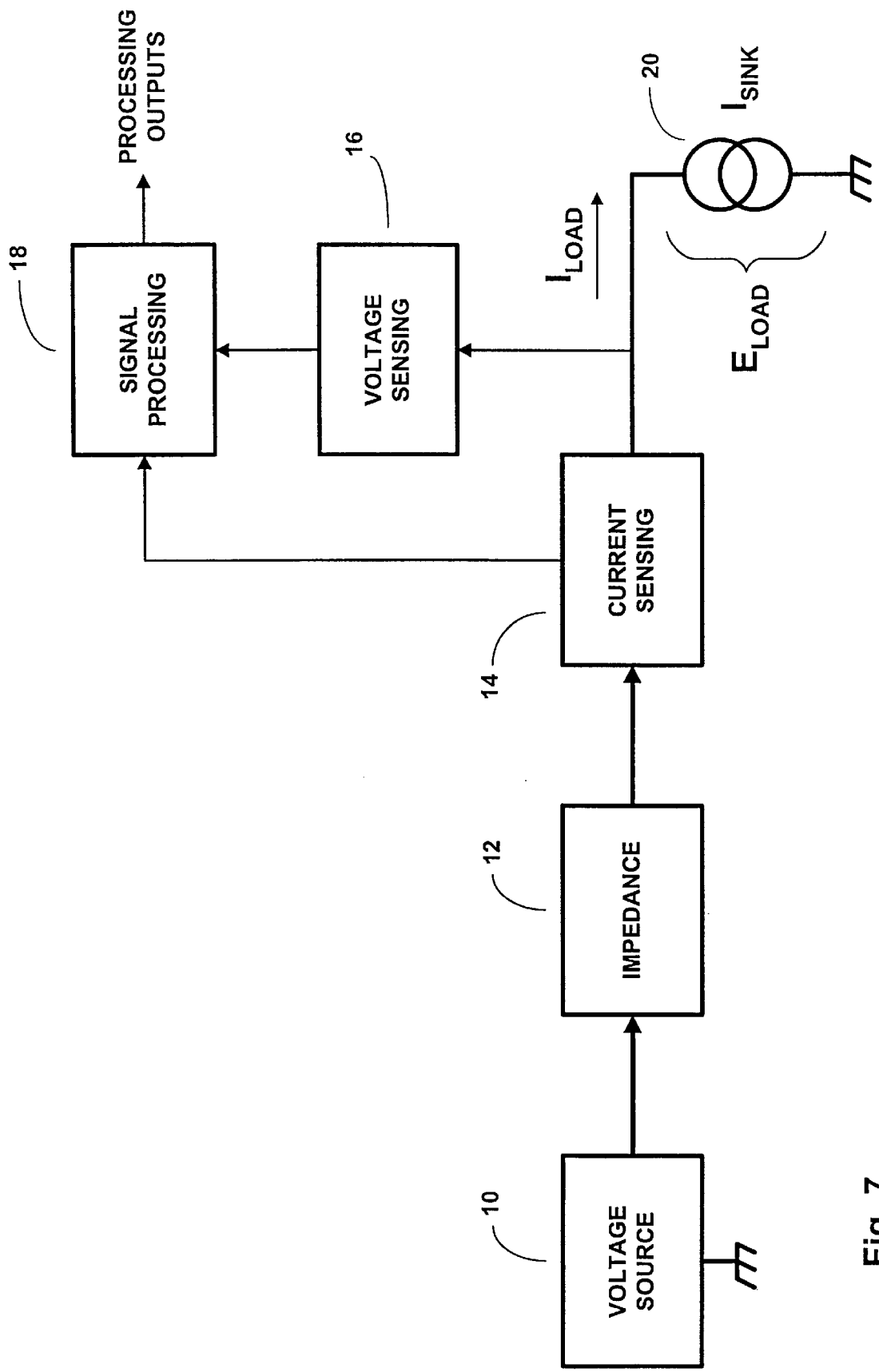
FIG. 7 shows a second case for the circuit shown in FIG. 5, where the current flow is load induced.

FIG. 7 shows a second case, where, because the current flow is load induced, the load $I_{sink}$, by definition, is a current source. Further, in order for current to flow from the source to the load (positive current flow using the adopted convention), the load current must be negative in sign. More conventionally, the load must be a current sink. In this case:

$E_{load} = E_{source} - I_{load} * Z_{series}$.

Setting $E_{source}$ to zero:

$E_{load} = -I_{load} * Z_{series}$;

or:

$-E_{load} = I_{load} * Z_{series}$.

From the equations given above, it is seen that the sign relationships between voltages developed across the load and current flow between the source and the load may be used to determine whether current flow is source or load induced. Since the circuits described are linear, superposition causes multiple source and load effects to operate independently, the overall effect in a system being the linear summation of individual effects. Further, it can easily be shown that the same sign relationships between voltage and current hold when current flows from the load into the source, i.e. when the current flow is negative using the adopted convention. This being the case, the sign relationships described hold for any source or load induced current and for any combination of source and load induced currents.

Returning for a moment to FIG. 5, it was previously noted that the series impedance placed between the source and the load causes the voltage $E_{load}$ to differ from the voltage $E_{source}$. Without this impedance, $E_{load} = E_{source}$, and it becomes impossible to determine polarity relationships between $E_{load}$ and $I_{load}$. Accordingly, there must be a non-zero impedance between the source and load for the concept described here to be effective.

From a theoretical standpoint, zero impedance is possible. In practice, it is difficult to achieve, in this case to advantage. Most practical situations will permit deliberate insertion of impedance or exploitation of unavoidable impedance.

There are many possible applications in which the polarity relationships described above may be usefully employed. Three general cases are described here:

1. In systems where distinctions between source and load induced currents are employed in feedback systems to control the system voltage source. The specific application described in FIGS. 8A through 11A to control undesired interactions between feedback signals used to synthesize output impedance and those used to eliminate DC offset voltages in laboratory grade AC voltage sources is an example of such a system. 2. In systems where the system voltage source is not controlled, but other sources are controlled to influence the summation of voltages and currents at the sensing locations. An example of such a system would be an active harmonic filter that selectively opposes currents generated by local harmonic sources while not generating signals to oppose currents caused by harmonic voltage sources located elsewhere in the larger system. 3. In systems where measurement is the objective rather than control. An example would be measuring instrumentation intended to provide information about whether currents flowing at the sensing point are caused by connected loads or by system voltage sources.

Figure 8A:
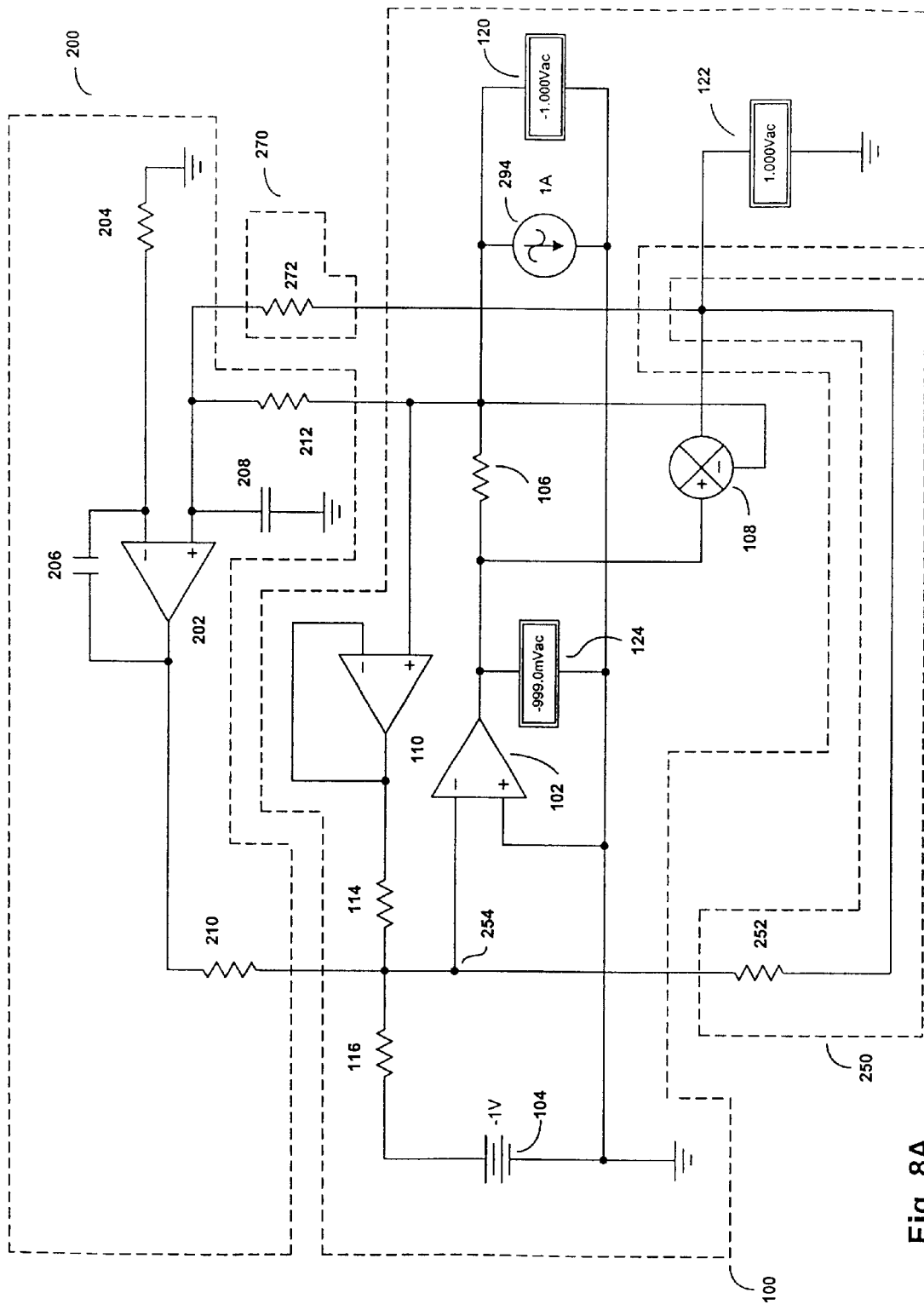
FIG. 8A is a power source circuit with a corrective detection circuit for a resistive output impedance component according to an embodiment of the present invention.

FIG. 8A shows a simplified implementation of a power source circuit for utilizing voltage and current polarities to distinguish between source and load induced current, according to the first case mentioned immediately above. The power source has a circuit which is the same as that shown in FIG. 4A, but with the addition of a detection circuit 270 which acts to couple the output of the current sensing differential gain block 108 into the DC offset elimination circuit 200. The detection circuit 270 comprises a resistor 272 which has one end connected to resistor 212 which in turn is connected to the positive terminal of operational amplifier 202. Operational amplifier 202 together with elements 204, 212, 206, and 208 comprises the differential integrator which provides corrective feedback to power amplifier summing junction 254 via resistor 210 thereby to effect elimination of undesired DC offset error voltages at the output of voltage source 100. The other end of resistor 272 is connected to the output of the differential gain block 108. Note that in contrast to the operation of the power source circuit shown in FIG. 4A, an output voltage of −1 volt is observed in meter 120 connected at the output of the power source circuit shown in FIG. 8A. An output voltage of −1 volt correctly reflects the effect of a one ampere load-induced current flowing through an output impedance of one ohm.

Recalling the earlier discussion noting the distinction between the source-induced and load-induced output voltage changes, it may be seen that the output voltage caused by the load-induced flow of one ampere in FIG. 8A is opposite in polarity from the current flow. If resistor 272 and the resistor 212 are of equal value, the desired output voltage of −1 volt and the output of +1 volt from the current sensing differential gain block 108 produce equal and opposite input signals into the differential integrator comprised of operational amplifier 202 and associated elements 204, 212, 206 and 208. In this example, the value of the resistor 272 is 100K ohm which is equal to that of resistor 212. In the absence of a net input signal, the DC offset elimination circuit comprises operational amplifier 202 and associated elements does not develop an output signal and therefore does not act to introduce a corrective signal via resistor 210 into summing junction 274 of inverting power amplifier 102. Thus DC output voltage induced by load current is not removed. However, the effects of internal DC offset sources represented by the input DC voltage source 104 are removed since there is no increase in load current and thus no current signal from differential gain block 108 to compensate the DC voltage produced at the output by the source. Further, if a DC current sink 118 as shown in FIG. 4 is replaced by a load impedance for the circuit shown in FIG. 8A, the output voltage and resulting source-induced output current would be of the same polarity, which would also result in the removal of the output voltage by DC offset elimination circuit 200 as desired.

Figure 8B:
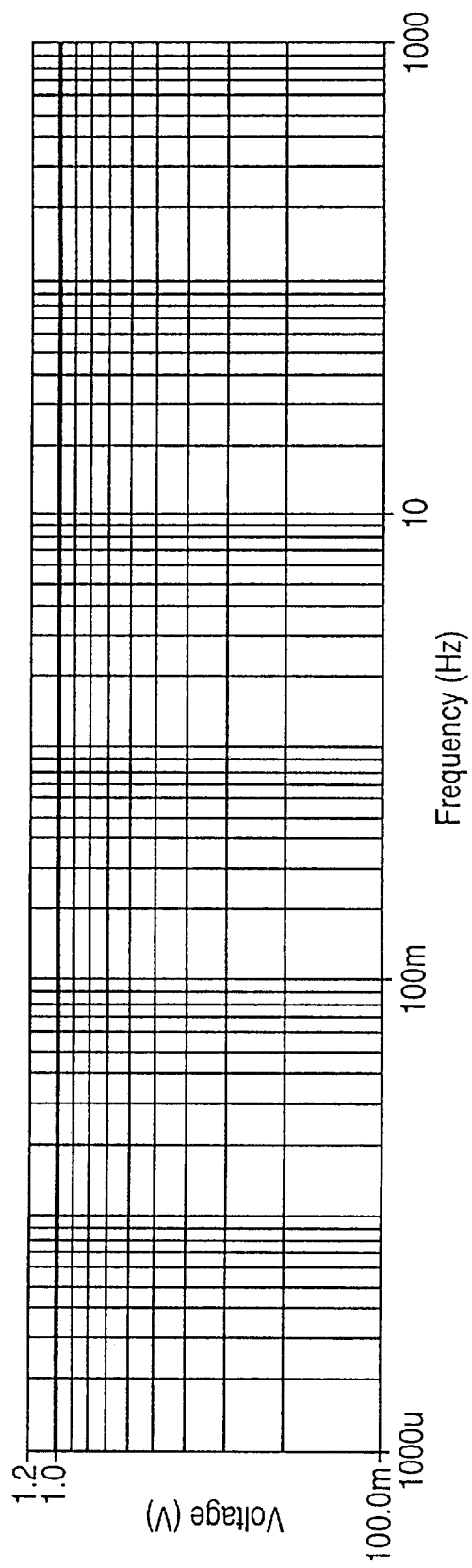
FIG. 8B shows the frequency response for a load-induced current of one ampere for the power source circuit shown in FIG. 8A.

FIG. 8B shows the frequency response for the power source circuit depicted in FIG. 8A. An AC current sink 294 is shown in FIG. 8A to represent a swept frequency AC current of one ampere drawn through the output impedance synthesized by the action of feedback via the output impedance circuit 250. Due to the aforementioned effects of the detection circuit embodied by resistor 272, the output impedance remains at a constant value of one ohm at all frequencies including DC.

Figure 2:
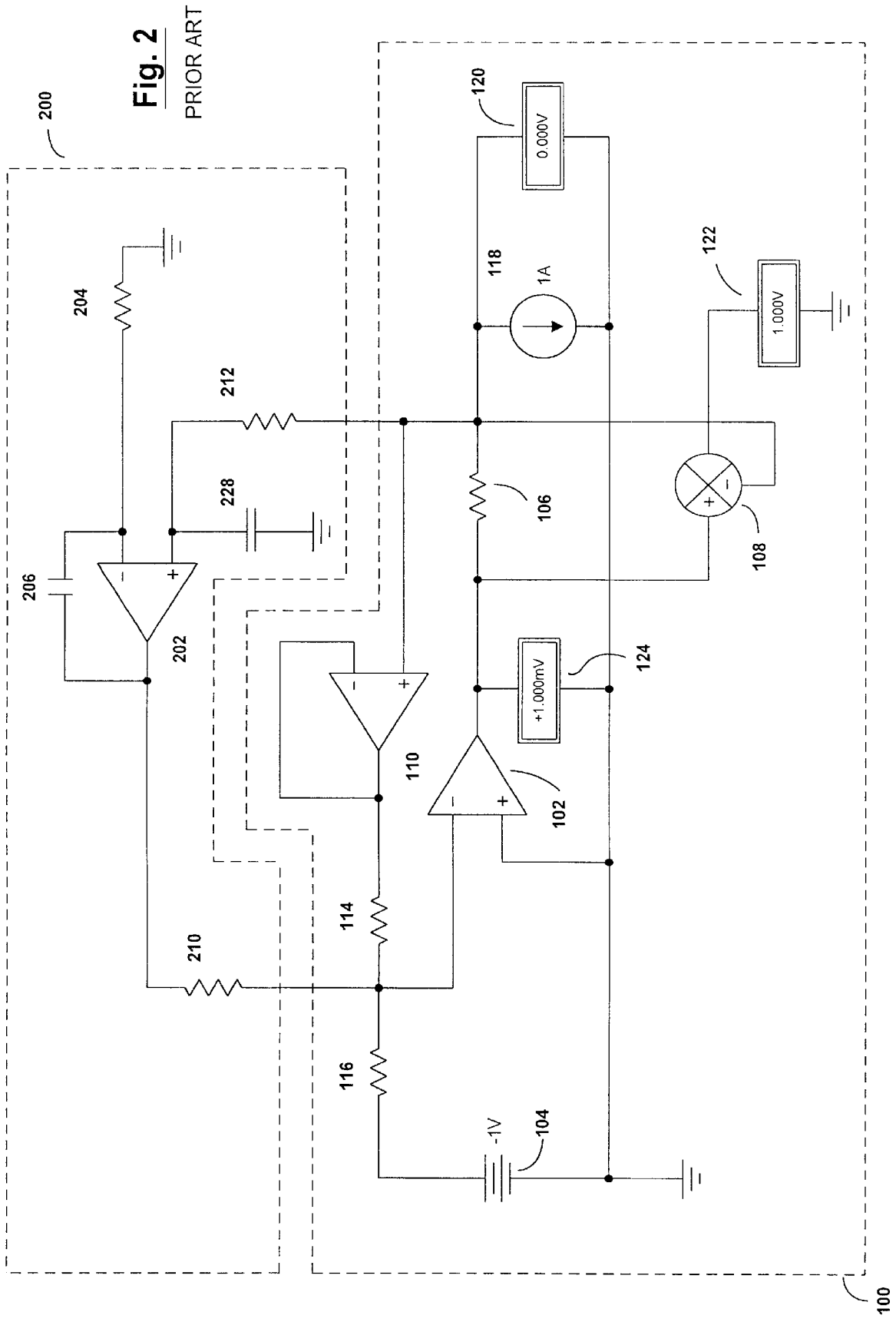
FIG. 2 is a schematic diagram of a fourth conventional voltage source, in which the voltage source shown in FIG. 1B has a DC offset elimination circuit.
Figure 3:
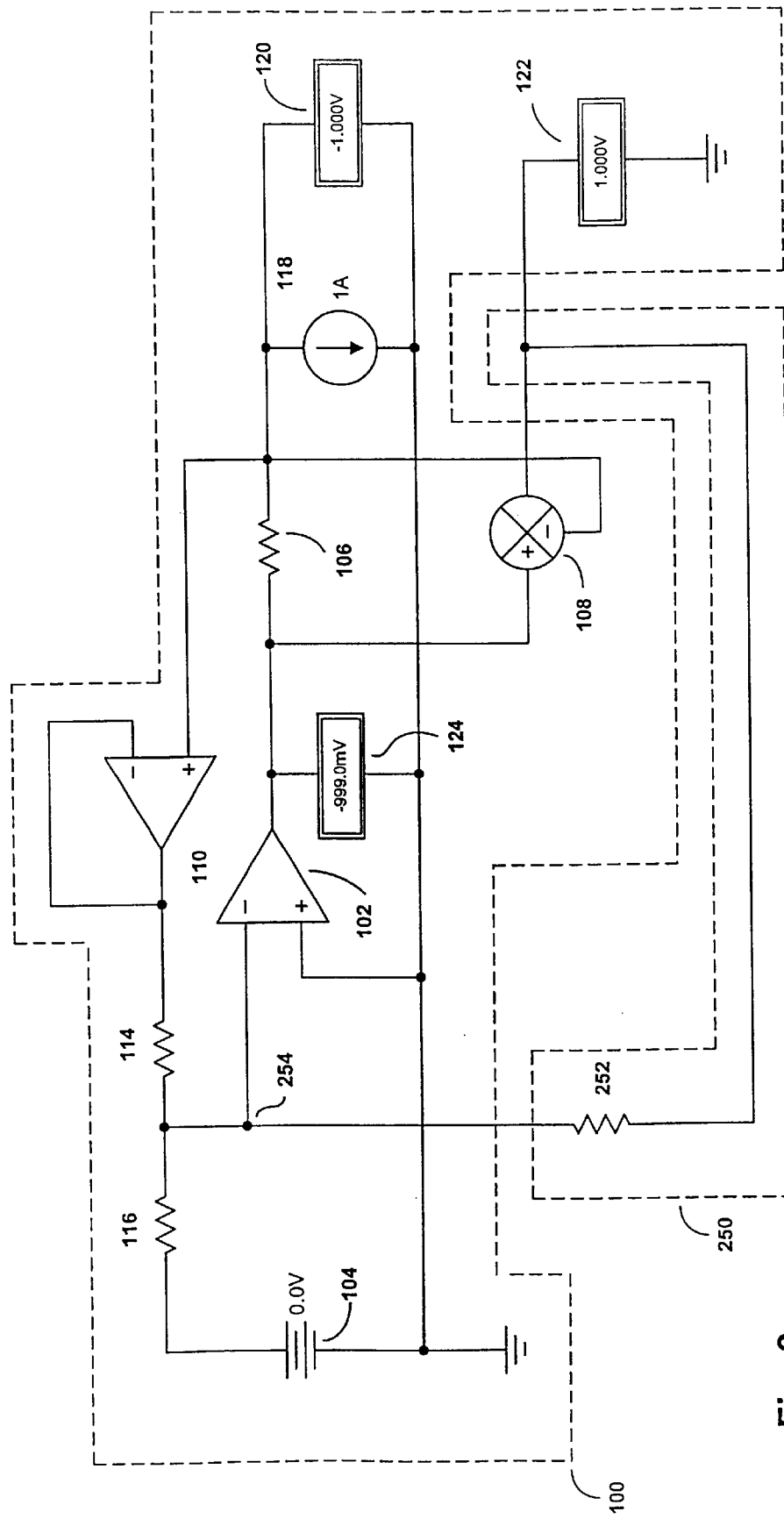
FIG. 3 is a schematic diagram of a fifth conventional voltage source, in which the voltage source shown in FIG. 1B has an output impedance circuit.

In the discussion of the frequency response of the DC offset elimination circuit 200 shown in FIG. 2, it was noted that the designer needed to consider the distinctions in frequency between desired source-induced signals and undesired source-induced signals. This distinction is critically important to proper application of the power source circuit shown in FIG. 8A because the described enhancement to the power source circuit is capable only of distinguishing between source-induced and load-induced signals. The enhancement provided by the detection circuit 270 cannot by itself distinguish between desired and undesired source-induced signals, in particular within the frequency band in which the DC offset elimination circuit 200 has significant gain. Because the enhancement provided by the detection circuit 270 works via the DC offset elimination circuit 200, its effect is also constrained to this same frequency range. For the application described, desired source-induced signals fall within the frequency range where the gain of the DC offset elimination circuit 200 is reduced to the point of having no effect. In other words, within the frequency range in which the DC offset elimination circuit 200 and the detection circuit 270 has sufficient gain to have effect, all source-induced signals are undesired and all load-induced signals are desired. The ability of the power source circuit to distinguish between source-induced and load-induced signals is necessary within this frequency range, but all source-induced signals may be removed indiscriminately. The inability of the power source circuit to distinguish between desired and undesired source-induced signals is irrelevant since this functionality is unnecessary for the intended application.

AC power system frequencies fall outside of the frequency range where either the DC offset elimination circuit 200 or the detection circuit 270 have sufficient gain to have effect. Nor is there any need for them to have effect since there are no undesired source-induced signals of consequence to be removed at these frequencies. Therefore, the inability to distinguish between desired and undesired source-induced signals is of no consequence in this frequency range either, and the overall operation of the power source circuit is as needed for a desired application.

For these same reasons, the described power source circuit may not be applied generally in applications where source-induced DC signals are desired. However, it will in all likelihood be possible to devise particular schemes by which desirable source-induced signals are distinguished from undesired source-induced signals with compensating inputs to the DC offset elimination loop provided to preserve desired signals.

Figure 9A:
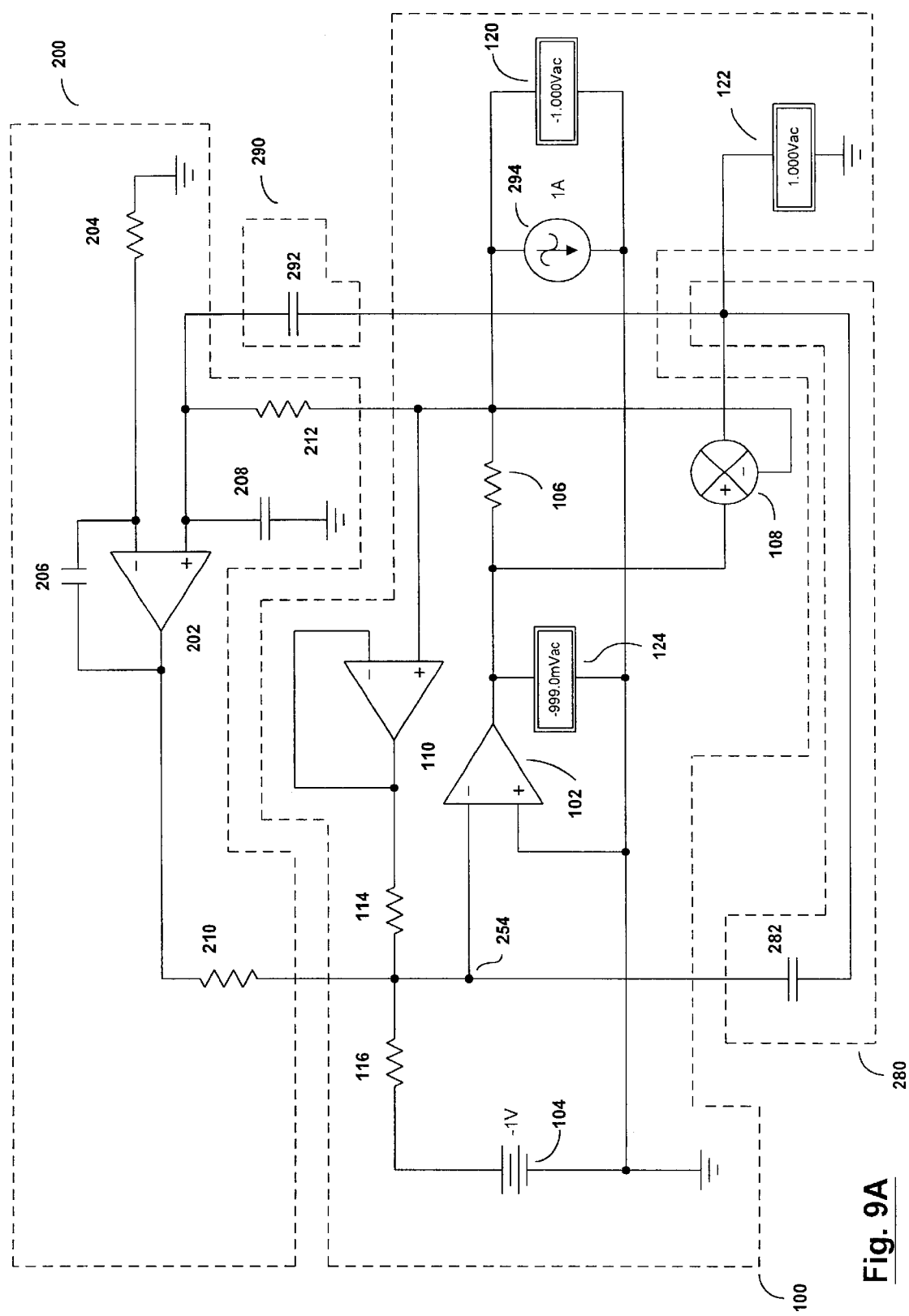
FIG. 9A is a power source circuit with a corrective detection circuit for an inductive output impedance component according to an embodiment of the present invention

Thus far, the discussion is focused on the resistive component of the loop implemented output impedance. The same concepts may be applied to the inductive component, however. As shown in FIG. 9A, the output impedance circuit 250 is replaced by the output impedance circuit 280. In other words, the feedback resistor 252 is replaced by a feedback capacitor 282. The capacitor 282 acts to differentiate the output current. The feedback signal is therefore proportional to di/dt and acts to produce the effect of an output inductance as described in U.S. Pat. No. 5,708,379 issued to Yosinski. Correspondingly, the detection circuit 270 is replaced by a detection circuit 290, so that the resistor 272 is equivalently replaced by a capacitor 292. In this example, the value of the capacitor 282 is 100 nF and the value of the capacitor 292 is 10 nF.

Figure 4A:
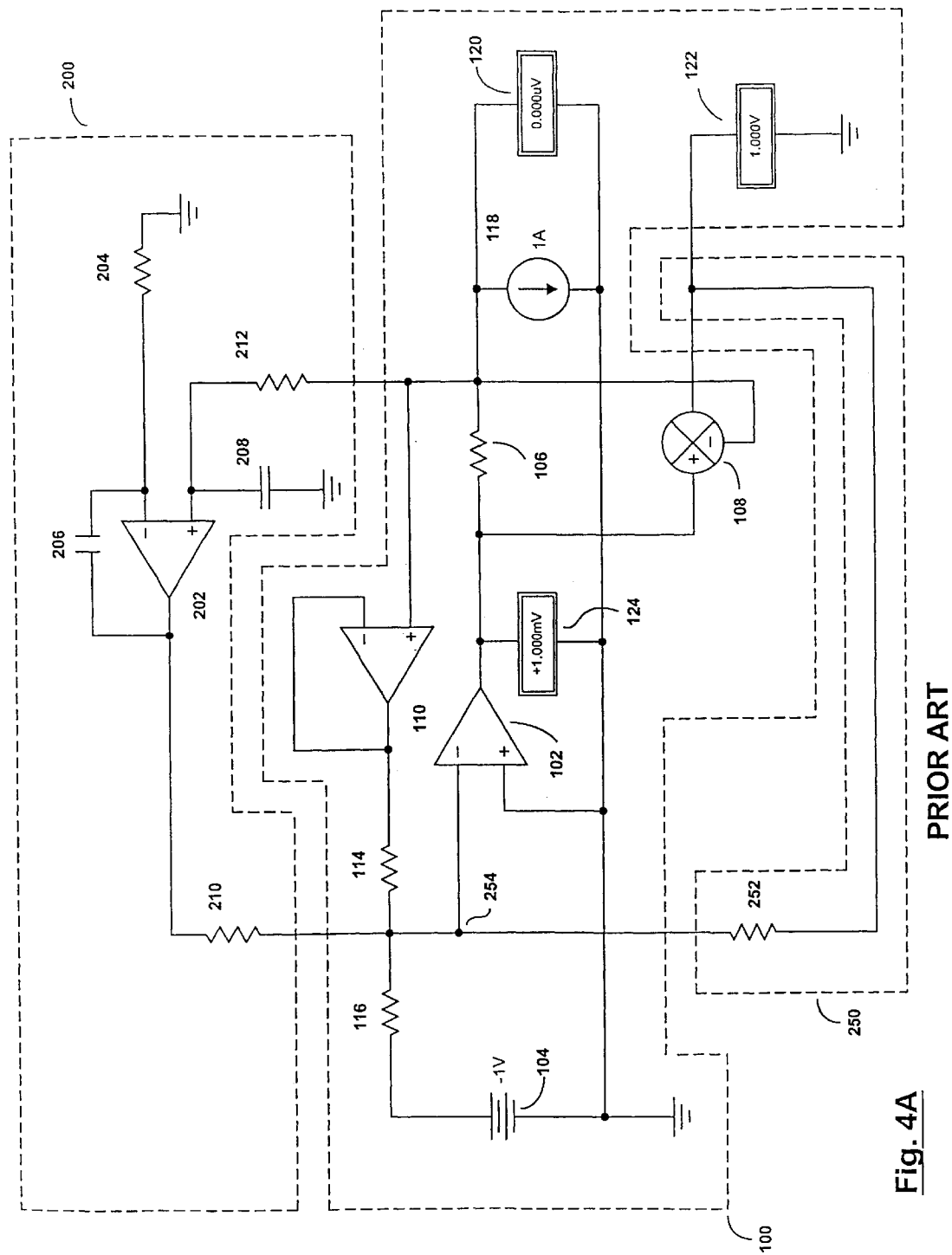
FIG. 4A is a schematic diagram of a sixth conventional voltage source, in which the voltage source shown in FIG. 1B has both the DC offset elimination circuit shown in FIG. 2 and the output impedance circuit shown in FIG. 3.
Figure 4B:
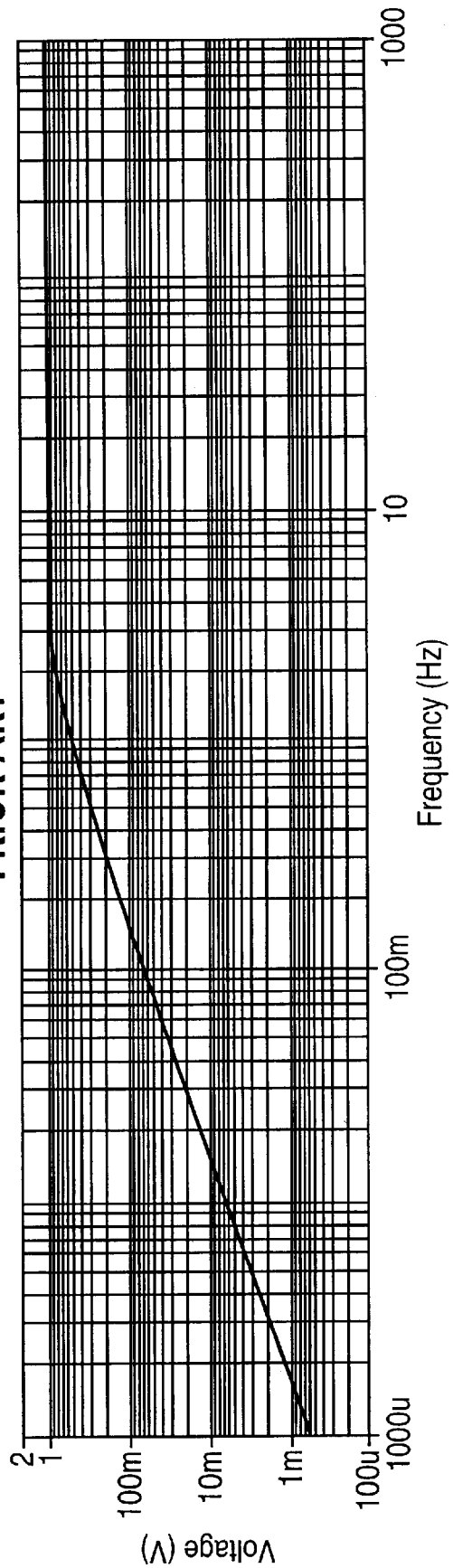
FIG. 4B is a graph of output voltage versus frequency of the voltage source shown in FIGS. 4A and 4C, said voltage developed across the source output impedance in response to load-induced current.
Figure 4C:
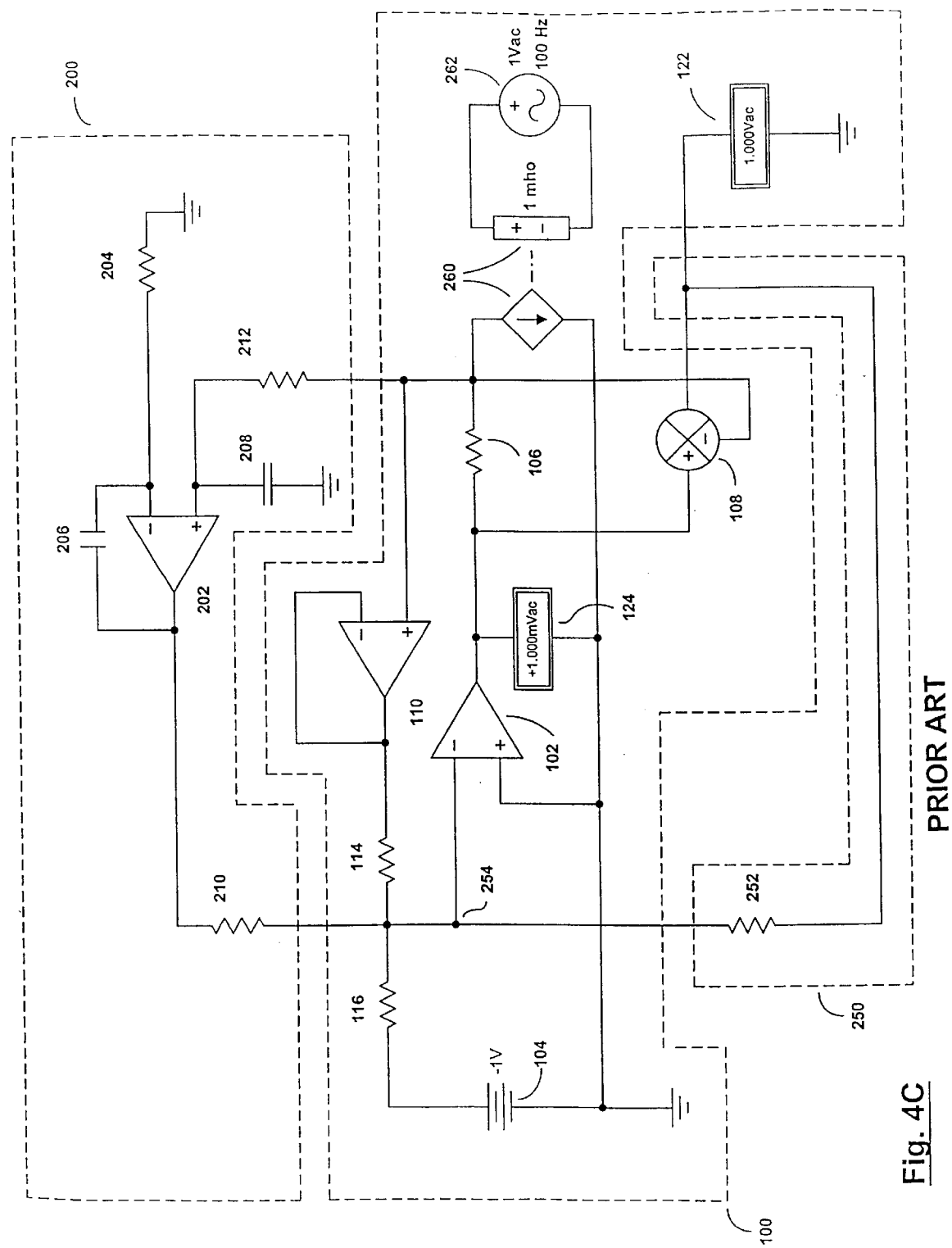
FIG. 4C is a schematic diagram of the voltage source shown in FIG. 4A, with a fixed DC current sink replaced with a voltage controlled swept-frequency frequency AC current sink, said reconfiguration of the load permitting examination of the voltage developed across the source output impedance versus frequency.

FIG. 9A shows the power source circuit of FIG. 4A modified to introduce an output impedance of 1 mH.

Figure 9B:
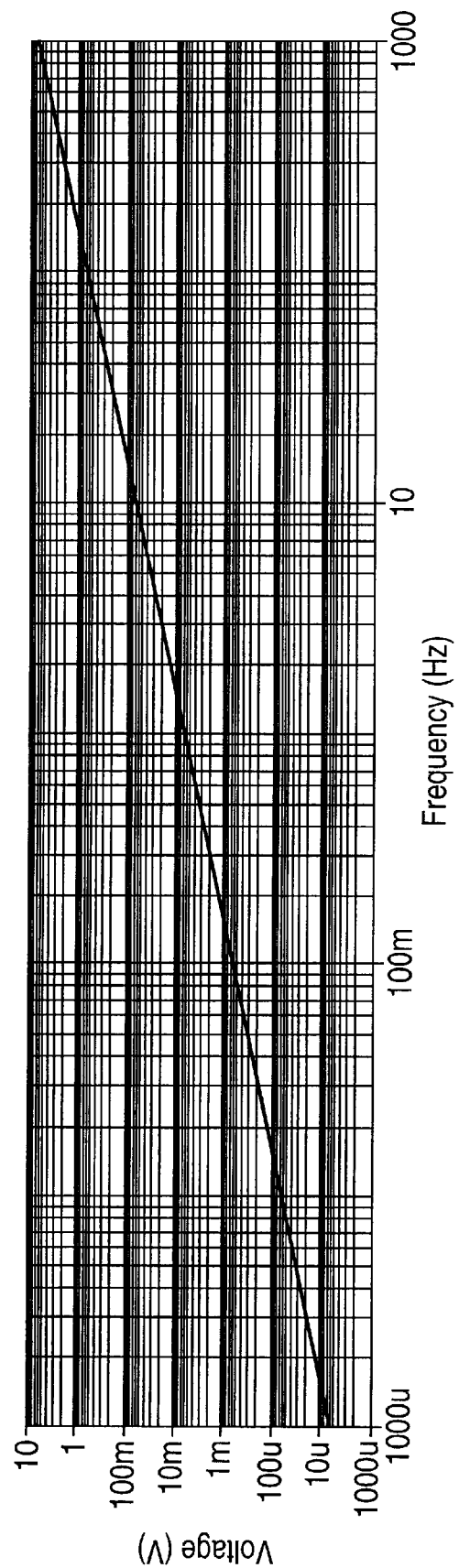
FIG. 9B shows the frequency response for a load-induced current of one ampere for the power source circuit shown in FIG. 9A.

FIG. 9B shows the frequency response for a load-induced current of one ampere. As in FIG. 8A, an AC current sink 294 is shown in FIG. 9A to represent a swept frequency load induced current of one ampere. As desired, the output impedance exhibits an inductive response characteristic rising at 20 db per decade with the correct magnitude of one ohm of inductive reactance at 159.15 Hz.

Figure 10:
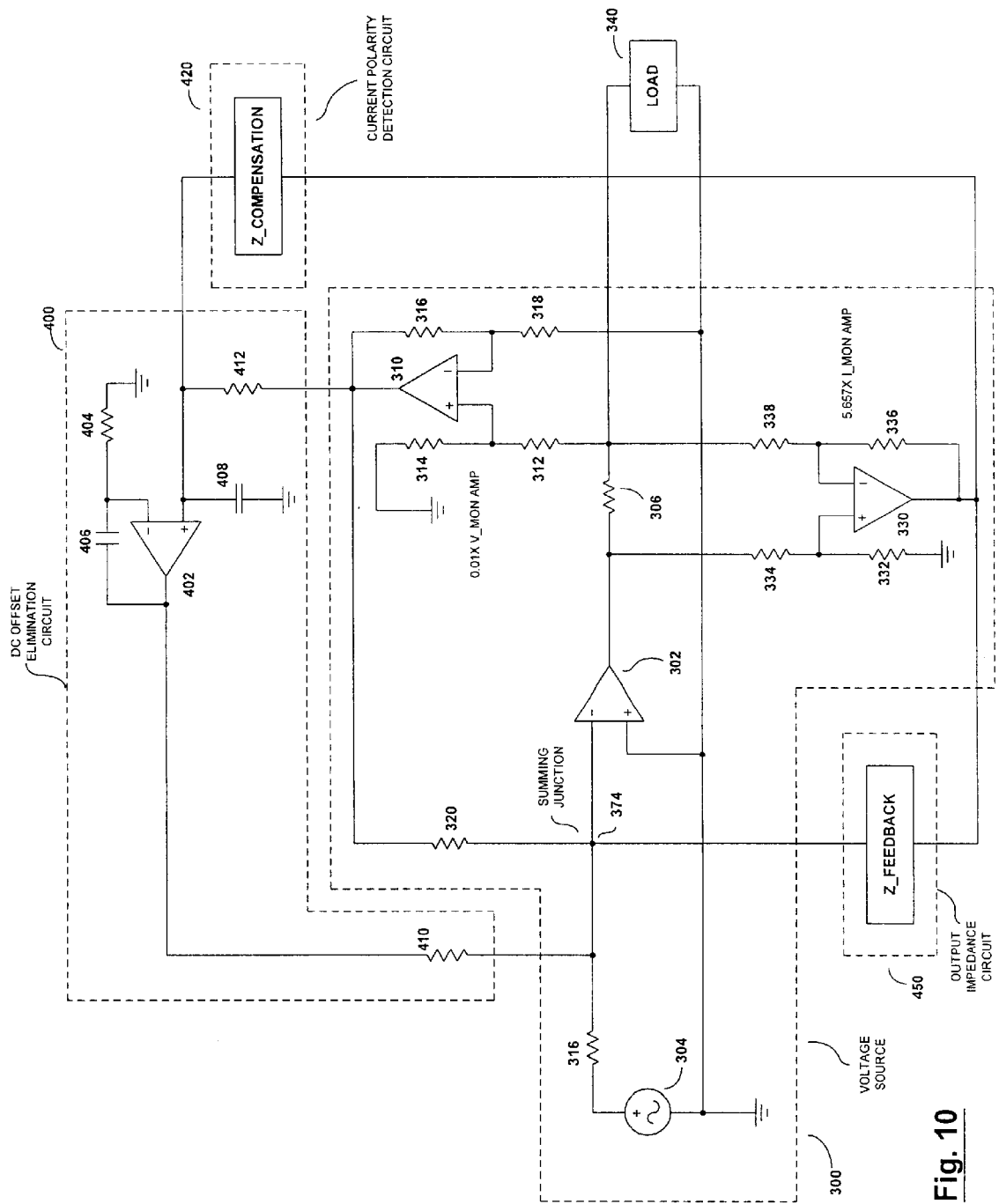
FIG. 10 is a schematic diagram of a realization of the power source circuit shown in FIGS. 8A and 9A, which includes complex impedance feedback loops for both resistive and inductive output impedance components together with correcting feedback paths for both impedance components.

FIG. 10 shows a practical realization of an AC power source circuit according to the present invention which includes complex impedance feedback loops together with correcting feedback paths into a DC offset elimination integrator. In this example, a voltage source 300 has a DC offset voltage circuit 400, an output impedance circuit 450 and a detection circuit 470 connected thereto.

The voltage source 300 has an AC input voltage source 304 which is shown in this example to reflect the intended function for voltage source 300 in contrast to previous examples where the input voltage source was given as a DC source to show injection of undesired DC offset voltages. Undesired DC offset voltage sources remain present in the system, but are not shown. A resistor 316 is connected between the AC input voltage source 304 and a negative terminal of inverting power amplifier 302, said node identified as summing junction 374. A current sensing element 306 is connected to the output of the inverting power amplifier 302, and ultimately is connected to a load 340 for the AC power source circuit.

A differential voltage sensing amplifier comprising an operational amplifier 310 and associated resistors 312, 314, 316, and 318 acts as a differential amplifier with a gain of 0.01X. One end of a resistor 312 is connected to the positive terminal of operational amplifier 310 and the other end connected to the right hand side of the current sensing element 306, said node being the output of voltage source 300. Connection of resistor 312 to the output of voltage source 300 constitutes the positive input signal to the differential voltage sensing amplifier formed by operational amplifier 310 and associated elements. The resistor 314 is connected between the positive terminal of the operational amplifier 310 and ground. The resistor 316 is connected between a negative terminal of the operational amplifier 310 and its output, and a resistor 318 has one end connected to the negative terminal of the operational amplifier 310 and the other end connected to the positive terminal of the inverting amplifier 302, which node is also the circuit "common" or ground for the entire system. This connection provides the negative input to the differential voltage sensing amplifier formed by operational amplifier 310 and associated elements. The resistor 320 is connected between the output of the operational amplifier 310 and the summing junction 374. In this example, resistors 312, 314, 316, 318, and 320 have values of 1M, 10K, 10K, 1M, and 10K ohms respectively.

The function of the voltage sensing amplifier formed by operational amplifier 310 and associated elements is to sample the output voltage of voltage source 300 and to provide said sample as a "negative" feedback signal to summing junction 374, such feedback providing means by which the output voltage of voltage source 300 may be controlled and regulated according to well understood principles. The attenuation factor of 100 (gain of 0.01X set by the ratio's of resistors 314 and 316 to resistors 312 and 318 respectively) provided by the voltage sensing amplifier causes voltage source 300 to exhibit a voltage gain of 100 at its output relative to AC input voltage source 304. Accordingly, as an example, a 3V r.m.s. signal at AC input voltage source 304 will cause a 300V r.m.s signal at the output of voltage source 300. The output voltage for voltage source 300 is developed between the node which is the junction of resistors 306, 312, and the load 340 and the node which is the circuit "common" or ground. The circuit "common" is connected to the other side of load 340, the positive input terminal of inverting power amplifier 302, the "low" or common side of voltage source 304 and to other nodes within the system requiring connection to the system ground reference.

A differential current sensing amplifier comprising an operational amplifier 330 and associated resistors 332, 334, 336, and 338 acts as a differential amplifier with a gain of 5.657X. A resistor 332 is connected between the positive terminal of operational amplifier 330 and ground, and a resistor 334 connected between the same positive terminal and the output terminal of the inverting power amplifier 302. Connection of the resistor 334 to the output terminal of inverting power amplifier 302 constitutes the positive input signal to the differential current sensing amplifier formed by operational amplifier 330 and associated elements. A resistor 336 is connected between the negative and output terminals of operational amplifier 330. A resistor 338 is connected between the negative terminal of the operational amplifier 330 and the output end of the current sensing element 306, this connection providing the negative input to the differential current sensing amplifier formed by the operational amplifier 330 and associated elements. The output of the differential current sensing amplifier is connected to and provides a sample of the output current to the output impedance circuit 450 and to the compensation circuit 420 which in turn is connected to the DC offset elimination circuit 400. In this example, the current sensing element 306 (a shunt) and resistors 332, 334, 336, and 338 have values of 0.01, 5.657K, 1 K, 5.657 K and 1 K ohms respectively.

The function of the current sensing amplifier formed by operational amplifier 330 and associated elements is to sample the output current and to provide the sample to the output impedance circuit 450, where it may be used to synthesize by means of feedback an output impedance for voltage source 300. The sample is also provided to detection circuit 420, where it may be used to detect output current polarity with respect to output voltage polarity thereby correcting the undesired interactions between operation of the output impedance and DC offset elimination circuits previously noted. For the values given as an example for the elements 306, 332, 334, 336, and 338, the current sensing amplifier provides an output signal of approximately 3.54 volts r.m.s. for an output current flow of 62.5 amperes r.m.s. (5 volts peak for an output current of if 88.4 amperes peak).

The DC offset voltage circuit 400 comprises an operational amplifier 402 and associated resistors 404 and 412 and capacitors 406 and 408. Together, operational amplifier 402 and associated elements act as a differential integrator. A capacitor 408 is connected between the positive terminal of operational amplifier 402 and ground, a capacitor 406 connected between the negative and output terminals of operational amplifier 402, and a resistor 404 is connected between the negative terminal of operational amplifier 402 and ground. Resistor 412 is connected between the positive input terminal operational amplifier 402 and the output terminal of operational amplifier 310, said connection providing the input signal to the differential integrator formed by operational amplifier 402 and associated elements. With connection to the voltage sensing amplifier formed by operational amplifier 310 and associated elements, means is provided by which the differential integrator may sample the output voltage of voltage source 300. In addition, a resistor 410 is connected between the output terminal of the operational amplifier 402 and the summing junction 374, said connection providing corrective feedback to eliminate undesired DC offset and low frequency AC signals from the output of voltage source 300 as described previously. In this example, the values of the capacitors 406 and 408 are each 1 uF, and the resistors 404, 412 and 410 have values of 100 K, 100 K and 10 K ohms, respectively.

The output impedance circuit 450 is connected between the summing junction 374 and the output terminal of the current sensing amplifier 330.

The detection 470 is connected between the output terminal of the current sensing amplifier 330 and the positive terminal of the differential integrator formed by operational amplifier 402 and associated elements.

Figure 11A:
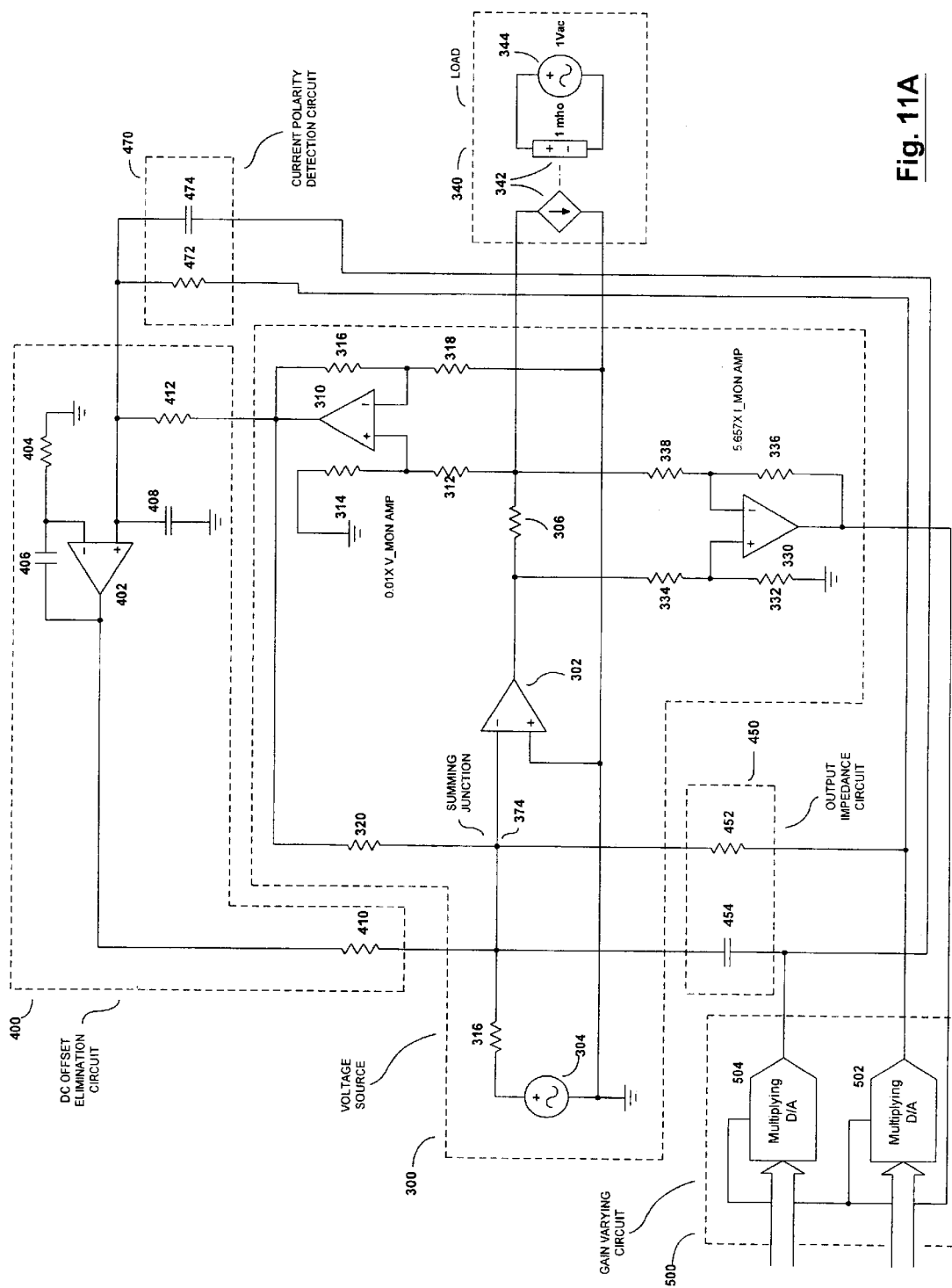
FIG. 11A is a particular embodiment of the power source circuit shown in FIG. 10.

FIG. 11A is a particular embodiment of the power source circuit shown in FIG. 10, and is merely one embodiment thereof. The power source circuit shown in FIG. 11 A includes both resistive and inductive feedback loops mentioned above with the correcting feedback paths into the DC offset elimination integrator. Since programmability is desired, a gain varying circuit 500 is introduced to allow control of the magnitudes of both impedance components. In this example, the output impedance circuit 450 comprises a capacitor 454 and a resistor 452. In this example, the capacitor 454 has a value of 17.68 nF and the resistor 452 has a value of 56.57 k ohm. The gain varying circuit 500 comprises multiplying D/A converter 502 to vary the gain for the resistive component and a multiplying D/A converter 504 to adjust the gain of the inductive component. Although desired for a variety of reasons, programmability is not necessary to overcome the drawbacks of prior art systems.

The detection circuit 470 comprises a resistor 472 and a capacitor 474. The value of resistor 472 is 565.7 k ohm and the value of capacitor 474 is 1.768 nF.

The corrective feedback into the DC offset elimination integrator 402 via resistor 472 and capacitor 474 is taken from the output of the gain varying circuit 500, thus ensuring that the correction signals properly vary in proportion to programmed changes in the output impedance.

The generalized load 340 given in FIG. 10 is shown comprising a voltage controlled current sink 342 and a controlling voltage source 344 in FIG. 11A. Together, elements 342 and 344 act to implement a swept frequency AC current sink of one ampere, the purpose of which is to permit examination of the output impedance versus frequency of the voltage source 300.

Figure 11B:
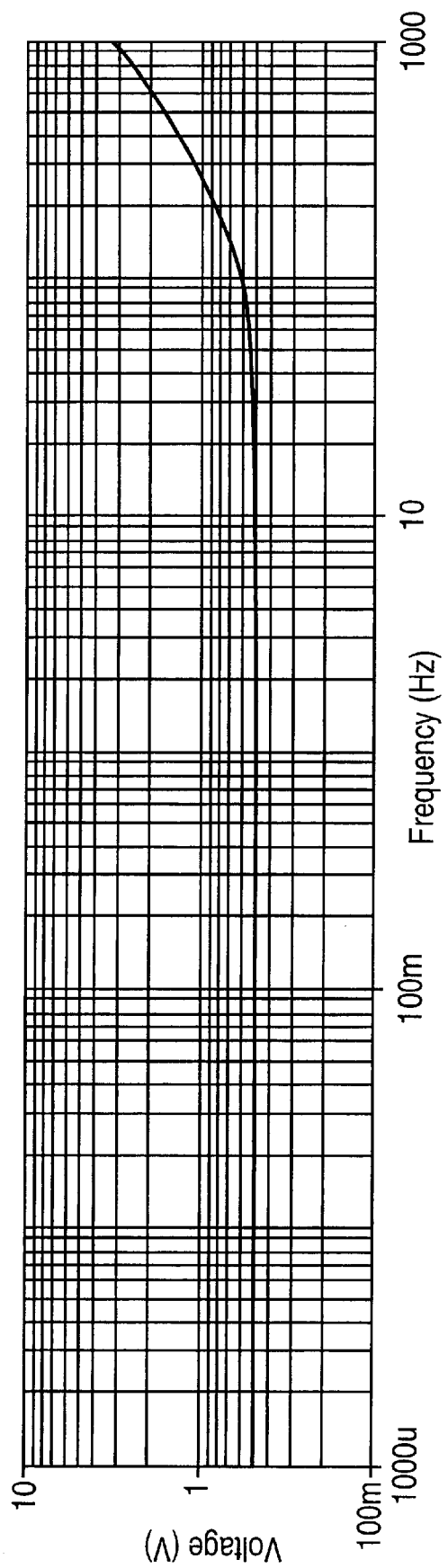
FIG. 11B shows the performance of the circuit of FIG. 11A with resistive and inductive components set to one-half scale (i.e., 0.5 ohm and 0.5 mH)

With regard to FIG. 11A, the component values expressed above follow from an actual realization in an AC source/analyzer having an output voltage capability to 300V r.m.s., output current capability to 62.5 A r.m.s., with programmable output impedance of 0–1 ohm resistive and 20 uH–1 mH inductive. FIG. 11B shows the performance of the circuit of FIG. 11A with resistive and inductive components set to one-half scale (i.e., 0.5 ohm and 0.5 mH). As would be expected, quadrature summation of the complex impedance at 159.15 Hz, where 0.5 mH equals 0.5 ohm, is 0.707 ohm in magnitude. This impedance is reflected in FIG. 11B as an output voltage of 0.707 volts developed across the loop-implemented output impedance in response to a swept-frequency load induced current of one ampere.

Because resistor 472 introduces a DC-coupled signal path from the current sensing element 306 to the summing junction of the DC offset elimination integrator 402, it is essential that the signal path exhibit minimal DC offset errors as these will introduce uncorrected DC errors at the source output. Offset sources at the input to the DC offset elimination integrator 402 will appear at the output multiplied by a factor of 100X. These errors could defeat the purpose of the DC offset elimination circuit 400.

In particular, 2-quadrant multiplying D/A converters are utilized in this embodiment. Analog multipliers which might otherwise be used exhibit large DC offset errors while multiplying D/A converters exhibit relatively low DC offset errors that are primarily due to the offset performance of the voltage output operational amplifier and the effects of leakage currents in the D/A proper. Both sources can be controlled to result in very low DC offset errors.

As can be seen in FIG. 11A, the only other DC offset error source of consequence in the critical signal path is the current sensing amplifier 330. This amplifier may also be selected to have very low offset errors. In the realizations employed thus far in the AC source/analyzer products, a single wide band current sensing differential amplifier is used. This amplifier has larger DC offset errors than would be the case using a narrow band, chopper-stabilized amplifier. Conflicts between the need for bandwidth and DC accuracy could be resolved by using a chopper-stabilized amplifier in parallel with the wide band amplifier. The chopper-stabilized amplifier's output would be used exclusively for the output impedance circuit 450 and DC offset elimination circuits 400 where wide band performance is not required.

With offset error sources controlled as described, either with or without use of the chopper-stabilized current sensing amplifier, DC error is introduced by addition of the signal path through resistor 472 and is acceptable for all but the most critical applications. Further improvements in the performance of components in the DC-coupled path are anticipated in the near future. Other DC offset error sources in the system are much less easily controlled in practical realizations, so inclusion of the DC offset elimination circuit remains a practical necessity. Thus, the benefit of the present invention is relevant.

The above implementation is programmable so that any resistive value between zero and 1 ohm and any inductive value between basically zero and 1 mH may be obtained. Another advantage in using the above-described loop implementation is use of small signal circuitry exclusively. Since discrete power resistors and power inductors are not involved, the function can very easily be made programmable.

Programmability is highly desirable because there are different standard values specified for various regions around the world to reflect differences in regional mains systems. The advantage to a programmable solution is that it may be readily reconfigured to conduct a test for a different region. of the world. Another advantage of using the feedback loop implementation is elimination of discrete power components. A feedback loop based implementation is dissipationless, whereas in a discrete implementation, there is high current flowing through power components with the resistive components dissipating quite a bit of power, typically on the order of several hundred watts.

Thus, with the addition of the detection circuit 470, the differential integrator 402 of the DC offset elimination circuit 400 is able to distinguish between a source induced current and a load induced current. By virtue of making this distinction the circuit is enabled to remove the source induced current by removing the voltage that produces it, thus removing both the source induced voltage and current, but does not remove the voltage developed across the output impedance in response to load induced current .

It may be considered that the detection circuit 470 is actually an enhancement of the DC offset elimination circuit 400 rather than an enhancement of the output impedance circuit 450 because the output impedance circuit 450 is not modified. It is performance of the output impedance circuit, however, which is corrected by virtue of the addition of the components of the detection circuit 470 feeding into the DC offset elimination circuit 400.

FIG. 8A shows the output impedance circuit 250 as just a resistive feedback loop, and FIG. 9A shows the output impedance circuit 280 as just an inductive feedback loop, separately. FIG. 11A shows that both of these in a practical realization, rather than being fixed, are made variable by feeding back the voltage that is proportional to output current through a gain adjusting circuit 500. Looking at FIG. 11A, the voltage at the output of the current sensing amplifier 330 is proportional to current and is fed through the two multiplying D/A converters 502 and 504, these acting as digitally programmable gain blocks. The two multiplying D/A's vary the amount of voltage which is fed back through capacitor 454 and resistor 452, and that has the effect of varying the output impedance.

The aforementioned described power source circuit can be made to work arbitrarily close to DC depending on whether there is a frequency difference between desired signals and signals not desired. The system as shown loses functionality at DC for the reason that the detection circuit cannot distinguish between an undesired and a desired source induced DC output. As noted previously, however, it may be anticipated that additional signals could be injected into the detection circuit to permit distinctions to be made between desired and undesired source induced signals.

In FIG. 11A, the small signal AC source 304, which is a 60 Hz AC source, is input to the amplifier 302. There is a sufficient difference in frequency between the 60 Hz input signal and the 1.59 Hz corner frequency of DC offset elimination circuit 400 that the gain of the DC offset elimination circuit is low enough to have no practical effect in removing the desired 60 Hz signal. In other words, the difference in frequency between desired and undesired source induced signals may be expressed as a ratio between a desired signal frequency and the DC offset elimination circuit corner frequency. The value for the ratio is selected according to the accuracy with which the desired signals are to be developed at the source's output. With a ratio of 50, for example, desired signals will be developed at the source's output with an attenuation of approximately −0.02% relative to values that would be expected without the effect of the DC offset elimination circuit, other circuit elements assumed to be ideal. This value for attenuation follows from the first order response characteristic of the DC offset elimination circuit according to well understood principles.

It is possible to go arbitrarily low in frequency so that for purposes of example in this disclosure the corner frequency is set to around 1 Hz and the generator lowest frequency would be about 50 Hz. It would be just as easily possible to make the AC source voltage 5 Hz, but if this is done the DC offset elimination circuit corner frequency would need to be set to a tenth of a Hz or thereabout to maintain similar accuracy (−0.02%) in generating the desired output signal.

The output of current sensing differential amplifier 330 is a voltage proportional to output current. The output of voltage sensing differential amplifier 310 is a voltage proportional to output voltage. The resistor 320 provides a feedback path for the voltage sensing signal developed at the output of operational amplifier 310, this feedback serving to regulate the output of the power source circuit internally. The resistor 412 provides the input to the DC offset elimination circuit 400 whereby DC content at the source output may be sensed and eliminated by the action of DC offset elimination circuit 400.

Capacitor 454 and resistor 452 are driven by the signal developed at the output of amplifier 330, said signal being the voltage proportional to output current.

The DC offset elimination circuit 400 and the output impedance circuit 450 function on the summing junction 374, which is the input to the negative terminal of power amplifier 302. Any signal that is fed back to summing junction 374 is added to all other signals fed back there into, and the overall function of the entire system is controlled by that feedback.

In the power source circuit of the present invention, what is desired is to distinguish between low frequency AC or DC voltages that appear at the output which are caused by the source as opposed to ones that are caused by the load.

Another feature that is needed is to have output impedance all the way down in frequency to DC. In practical terms, if there is an output impedance and one tries to draw current out of the source at DC, a voltage is going to develop across the impedance which means that a DC voltage is present. In this case, the voltage is caused by the load, not by the source, and such a result is desirable. But the DC offset elimination circuit removes this voltage as well as removing DC voltages that were induced by the source (which is the undesired behavior).

By adding a detection circuit as disclosed, it is possible to distinguish between source induced voltages appearing at the output either at DC or at very low AC frequencies and load induced voltages appearing at the output either at DC or at very low AC frequencies.

The power source circuit according to the present invention allows both the DC offset removal circuit and the output impedance circuit to function simultaneously by distinguishing between source induced DC and low frequency AC output voltages and load induced DC and low frequency AC output voltages.

Without benefit of the disclosed invention, the DC offset elimination circuit and the output impedance circuit would interact at low frequencies in a way that compromises the performance of the output impedance circuit. This effect is not significant at high frequencies, but at low frequencies where the DC offset elimination circuit is active.

The second type of system described in relation to FIG. 5 is in the field of shunt filtering of harmonic currents in AC power systems. Use in industry and elsewhere for this functionality has to do with the fact that many electrical and electronic products draw harmonic currents from a main system in addition to currents at the line frequency. The electricity supply utility industry does not wish to supply harmonic currents to connected loads, especially large industrial loads since such currents contribute to loss and efficiency and other ill effects. The electric utility industry therefore is seeking regulation that would constrain harmonic current "emissions". At the present time there is considerable controversy surrounding this issue with utilities attempting to sponsor regulation that would force product manufacturers to redesign their products. Similar efforts are underway to establish requirements for so-called "high impact" residential loads such as television receivers and personal computers. Not surprisingly, manufacturers are vigorously resisting these initiatives.

A compromise solution is to add what is called active filter technology. Active filters typically operate by drawing power at fundamental frequencies and re-injecting this power as reactive power at harmonic frequencies in a manner which tends to counteract and cancel voltages developed at harmonic frequencies in response to load induced harmonic current drain. One problem for systems of this type is to distinguish between harmonic voltages developed in response to locally connected loads and harmonic voltages transported from elsewhere in the system. An active filter of practical size may be selected to compensate and correct for local effects, but cannot practically be sized to correct for effects throughout the entire system.

As an example, if active filter technology is used in residences, the same may be placed at the service entrance to the residence. The filter control circuit would need to distinguish between harmonic currents generated by equipment inside the residence and harmonic currents brought into the residence because of voltage sources in the utility system. The "opposite sign effect" discussed above is usable to distinguish between source-induced current and load-induced current in this application. This "opposite sign effect" relates to the fact that when the output voltage is source induced, the sign or polarity of the voltage and the current are the same, but when the voltage is load induced, the polarities are opposite. The voltages and currents are out of phase with one another from an AC standpoint. From a DC standpoint, they're just opposite in sign.

Undesired harmonic voltages are locally developed because of load induced harmonic current flowing through an impedance that is unavoidably present in practical utility distribution systems. Since the opposite sign effect is usefully present when source impedance is present, the disclosed invention may be used to distinguish between locally induced currents (i.e. load induced) and currents flowing as a result of source voltages (i.e. source induced). The difference in frequency between desired fundamental frequency signals and undesired signals at harmonic frequencies meets the remaining condition necessary for the disclosed invention to be usefully employed in this and similar applications.

The example of active harmonic filtering in AC power distribution systems is but one example of a system where the system voltage source is not controlled, but other sources are controlled to influence the summation of voltages and currents at the sensing locations.

The third type of system described in FIG. 5 relates to a device where measurements are the objective rather than control. As noted above, an example would be measuring instrumentation intended to provide information about whether currents flowing at the sensing point are caused by connected loads or by system voltage sources.

It should be noted that the values pertaining to the specific elements throughout the embodiments of the present invention have been included merely as examples, and the present invention should not be limited to such values. One of ordinary skill in the art would readily recognize that other sets of values would still provide the benefits of the present invention. Further, the elements which form the various circuits, such as the voltage source, the output impedance circuit, the DC offset voltage elimination circuit and the detection circuit, have been disclosed merely as embodiments of these circuits, and the present invention should not be limited to such elements. One of ordinary skill in the art would readily recognize that other configurations of the various circuits would still make the present invention operational and provide the benefits thereof.

According to the present invention, a device uses the concept of the polarity of the output current versus that of the output voltage to determine whether the current flow is load induced or source induced in the fact of an impedance that causes an output voltage in response to currents that are load induced.

With regard to the power source circuit, a detection circuit distinguishes between a source induced output voltage and a load current induced output voltage and corrects the operation of the DC offset elimination circuit that removes the DC and low frequency AC components of the source induced output voltage. The specific application of the concept is based on the same versus different polarities of the output current and output voltage. The difference in polarity is an actual outgrowth of what occurs when there is a source with an impedance and the current and output voltage are of the same polarity when the current flow into the load is source induced and they are opposite in polarity when current flow is load induced.

The present invention detects the polarity of the output current as well as the polarity of the output voltage and determines whether the polarities are the same or opposite making a distinction whether the current flow is load induced or source induced based upon the sameness or oppositeness of the polarities. Thus, the present invention makes a distinction between whether the current flow is source induced or load induced, and then controls operations of specific functions.

What is claimed is:

1. A source having an impedance and connected to a load, the source comprising:
   a detection circuit to determine whether a current flow through the impedance is load-induced or source-induced, said detection circuit comprising:
      a current sensing element providing information about the magnitude and polarity of the current flow between the source and the load, and
      a voltage sensing element sensing voltages developed at the load in response to the current flow and providing magnitude and polarity information; and
   a processing circuit, receiving output signals from the current sensing element and the voltage sensing element, to perform an operation based upon whether the current flow is load-induced or source-induced and upon the output signals.

2. The source as claimed in claim 1, wherein the detection circuit determines polarities of the current flow and an output voltage across the load, and determines the current flow to be source-induced or load-induced based upon the polarities of the current flow and the output voltage.

3. The source as claimed in claim 1, wherein the detection circuit determines polarities of the current flow and an output voltage across the impedance, and determines the current flow to be source-induced if the polarities are the same and load-induced if the polarities are opposite to each other.

4. The source as claimed in claim 1, further comprising:
   a voltage source to generate an output voltage;
   a DC offset elimination circuit, which is a DC servo control loop connected to the voltage source, to eliminate DC offset voltages of the output voltage; and
   an output impedance circuit, which is a feedback loop connected to the voltage source, to generate an output impedance for the source and which operates simultaneously with the DC offset elimination circuits;
   wherein the detection circuit is connected between the DC offset elimination circuit and the output impedance circuit, determines whether the current flow is load-induced or source induced, and the processing circuit eliminates the current flow which is source-induced.

5. The source as claimed in claim 1, wherein the source is an active harmonic filter that selectively opposes currents generated by local harmonic sources while not generating signals to oppose currents caused by harmonic voltage sources located elsewhere in a system.

6. A method of controlling operations of a source which is connected to a load, the method comprising:
   determining whether a current flow through an impedance of the source is load-induced or source-induced; and
   controlling one of the operations based upon whether the current flow is load-induced or source-induced and based upon information provided by a current sensing element about the magnitude and polarity of the current flow between the source and the load, and information provided by a voltage sensing element about voltages developed at the load in response to the current flow and about magnitude and polarity.

7. The method as claim 6, wherein the determining comprises:

determining polarities of the current flow and an output voltage across the impedance; and determining the current flow to be source-induced or load-induced based upon the polarities of the current flow and the output voltage.

8. The method as claimed in claim 7, wherein the determining comprises:

determining polarities of the current flow and an output voltage across the impedance; and determining the current flow to be source-induced if the polarities are the same and load-induced if the polarities are opposite to each other.

* * * * *